(12) United States Patent
Hashimoto

(10) Patent No.: US 7,330,024 B2
(45) Date of Patent: Feb. 12, 2008

(54) POWER SUPPLY DEVICE, TEST APPARATUS, AND POWER SUPPLY VOLTAGE STABILIZING DEVICE

(75) Inventor: Yoshihiro Hashimoto, Tokyo (JP)

(73) Assignee: Advantest Corporation, Tokyo (JP)

( * ) Notice: Subject to any disclaimer, the term of this patent is extended or adjusted under 35 U.S.C. 154(b) by 152 days.

(21) Appl. No.: 11/284,224

(22) Filed: Nov. 21, 2005

(65) Prior Publication Data

US 2006/0072273 A1  Apr. 6, 2006

Related U.S. Application Data

(63) Continuation of application No. PCT/JP04/006934, filed on May 21, 2004.

(30) Foreign Application Priority Data

May 21, 2003  (JP) .............................. 2003-143726
Feb. 26, 2004  (JP) .............................. 2004-051740

(51) Int. Cl.
*G01R 31/28* (2006.01)
(52) U.S. Cl. .................................................. 324/158.1
(58) Field of Classification Search ................ 324/690;
363/23; 702/149, 154
See application file for complete search history.

(56) References Cited

U.S. PATENT DOCUMENTS 3,353,080 A * 11/1967 Santelmann, Jr. ............. 363/23
4,757,433 A *  7/1988 Santelmann, Jr. ............. 363/19
5,274,336 A * 12/1993 Crook et al. ................. 324/690
5,594,359 A    1/1997 Hashimoto (Continued)

FOREIGN PATENT DOCUMENTS

JP  7-36298  8/1995

(Continued)

OTHER PUBLICATIONS

International Search Report issued for International application No. PCT/JP2004/006934 mailed on Sep. 7, 2004, 2 pages.

*Primary Examiner*—Ha Tran Nguyen
*Assistant Examiner*—Richard Isla-Rodas
(74) *Attorney, Agent, or Firm*—Osha Liang LLP

(57) ABSTRACT

A power supply device for supplying source current to an electronic device comprises: a current output unit for outputting output current including at least the source current as a component of the current thereof; a connection resistor which electrically connects the current output unit and the electronic device for supplying the source current to the electronic device; a low-pass filter for allowing the output voltage of the current output unit to pass through; a differential detection unit for detecting the electric potential difference between the output voltage of the low-pass filter and the electric potential at the device-side terminal of the connection resistor; and a parallel load unit which is connected to the output terminal of the current output unit in parallel with the connection resistor, and which has a function of consuming a partial current which is a part of the output current of the current output unit in a case that the electric potential difference detected by the differential detection unit is smaller than a predetermined value, and which has a function of stopping reception of the partial current in a case that the electric potential difference detected by the differential detection unit has become greater than a predetermined value.

14 Claims, 15 Drawing Sheets

U.S. PATENT DOCUMENTS

| | | | |
|---|---|---|---|
| 5,773,990 A * | 6/1998 | Wilstrup et al. | 324/765 |
| 6,073,259 A * | 6/2000 | Sartschev et al. | 714/724 |
| 6,136,512 A * | 10/2000 | Doeling | 430/313 |
| 7,162,652 B2 * | 1/2007 | Issa et al. | 713/300 |

FOREIGN PATENT DOCUMENTS

| | | |
|---|---|---|
| JP | 9-145749 | 6/1997 |
| JP | 2003-84048 | 3/2003 |

* cited by examiner

POWER SUPPLY DEVICE, TEST APPARATUS, AND POWER SUPPLY VOLTAGE STABILIZING DEVICE

CROSS REFERENCE TO RELATED APPLICATION

This is a continuation application of PCT/JP2004/006934 filed on May 21, 2004 which claims priority from Japanese Patent Applications Nos. JP 2003-143726 filed on May 21, 2003 and JP 2004-051740 filed on Feb. 26, 2004, the contents of which are incorporated herein by reference.

BACKGROUND OF THE INVENTION

1. Field of the Invention

The present invention relates to a power supply device, a test apparatus, and a power supply voltage stabilizing device. In particular, the present invention relates to a power supply device for supplying source current to an electronic device.

2. Related Art

Electronic devices employing CMOS semiconductors and so forth have the nature of great change in source current due to the actions of the internal circuit thereof. On the other hand, conventional voltage generating circuits for an electronic-device performance/characteristic test are known, which have a function for supplying voltage to a load with small change in voltage as disclosed, for example, in Japanese Unexamined Patent Application Publication No. 7-333249 (pp. 2 to 4, FIGS. 1 to 5).

In recent years, improved fine processing technology has accelerated development of high-speed and low-power-consumption electronic devices, requiring a small margin of change in voltage to be applied to such electronic devices. Accordingly, a test apparatus for testing such electronic devices requires a higher-precision power supply device.

SUMMARY OF THE INVENTION

Accordingly, it is an object of the present invention to provide a power supply device, a test apparatus, and a power supply voltage stabilizing device, which have functions for solving the aforementioned problems. The aforementioned object is defined by a combination of features described in the independent claims. Furthermore, dependent claims provide specific arrangements having further advantages Means for Solving the Problems That is to say, according to a first aspect of the present invention, a power supply device for supplying source current to an electronic device comprises: a current output unit for outputting output current including at least the source current as a component of the current thereof; a connection resistor which electrically connects the current output unit and the electronic device for supplying the source current from the current output unit to the electronic device; a low-pass filter having a cut-off frequency lower than the frequency at which the source current applied to the electronic device changes, for allowing the output voltage of the current output unit to pass through while suppressing components frequencies higher than the cut-off frequency; a differential detection unit for detecting the electric potential difference between the output voltage of the low-pass filter and the electric potential at the device-side terminal of the connection resistor, which is closer to the electronic device; and a parallel load unit which is connected to the output terminal of the current output unit in parallel with the connection resistor, and which has a function of consuming a partial current which is a part of the output current of the current output unit in a case that the electric potential difference detected by the differential detection unit is smaller than a predetermined value, and which has a function of stopping reception of the partial current from the current output unit in a case that the electric potential difference detected by the differential detection unit has become greater than a predetermined value.

Also, the power supply device may further comprise: a smoothing capacitor which is provided at a position upstream of the connection resistor in the current direction, and which has a function of smoothing the source current; and a device-side capacitor with a smaller electrostatic capacitance than that of the smoothing capacitor, which is provided at a position downstream of the connection resistor in the current direction, and which has a function of smoothing the source current applied to the electronic device through the connection resistor.

Also, at least a part of the low-pass filter, the differential detection unit, and the parallel load unit may be provided on a printed wiring board on which wiring has been formed for electrically connecting the current output unit and the electronic device. Also, the connection resistor may be a pattern resistor formed on the printed wiring board.

Also, the differential detection unit may include: a reference voltage output unit for outputting either a first reference voltage or a second reference voltage, which is smaller than the first reference voltage, by dividing the output voltage of the low-pass filter; a comparison unit for making a comparison between the reference voltage output from the reference voltage output unit and the electric potential at the device-side terminal; and a reference voltage setting unit which has a function of controlling the reference voltage output unit so as to output the second reference voltage in a case that the electric potential at the device-side terminal becomes greater than the first reference voltage, and which has a function of controlling the reference voltage output unit so as to output the first reference voltage, in a case that the electric potential at the device-side terminal becomes smaller than the second reference voltage, according to the output of the comparison unit. With such an arrangement, the parallel load unit may consume the partial current received from the current output unit by applying the partial current to a path provided in parallel with the connection resistor during a period from the point in time that the electric potential at the device-side terminal has become greater than the first reference voltage up to the point in time that the electric potential has become smaller than the second reference voltage, according to the output of the comparison unit. Furthermore, the parallel load unit may stop application of the partial current to the parallel path during a period from the point in time that the electric potential at the device-side terminal has become smaller than the second reference voltage up to the point in time that the electric potential has become greater than the first reference voltage according to the output of the comparison unit.

Also, the parallel load unit may include: a low-speed switch connected in parallel with the connection resistor for performing opening/closing actions at a lower switching speed than the response speed at which the output current of the current output unit changes in response to change in the source current applied to the electronic device; and a high-speed switch, connected in parallel with the connection resistor and in series with the low-speed switch, for performing opening/closing actions at a higher switching speed than the response speed of the current output unit according to the output of the differential detection unit. Also, the low-speed switch may be turned on after the output voltage of the low-pass filter has become approximately the same as the output voltage of the current output unit.

Also, an arrangement may be made in which the parallel load unit is connected in parallel with the connection resistor, and includes a switch for performing opening/closing actions according to the output of the differential detection unit. Furthermore, the power supply device may further include a time measurement unit for measuring on-time, for which the switch is in the on-state, or off-time, for which the switch is in the off-state, in the measurement period for the average consumed current of the electronic device. Also, the time measurement unit may include: a counter for counting the on-time or the off-time in the measurement period in increments of a cycle which is obtained by dividing the measurement period by the 2 to the power of n (note that n represents a positive integer);

and a DA converter for converting the on-time or the off-time, counted by the counter in increments of the cycle, into an analog value.

Also, the power supply device may further include a consumed current calculation unit for calculating the average consumed current of the electronic device over the measurement period based upon the on-time or the off-time measured by the time measurement unit and the current value of the output current. Also, an arrangement may be made in which in a case that the switch is in the on-state, the parallel load unit consumes the same amount of the partial current as that of the output current. Furthermore, the consumed current calculation unit may calculate the average consumed current by multiplying the average of the output current over the measurement period by the ratio of the off-state as to the measurement period.

Also, the consumed current calculation unit may calculate the average consumed current based upon the current value of the partial current in the on-state of the switch. Also, the consumed current calculation unit may calculate the average consumed current by subtracting the product of the current value of the partial current in the on-state of the switch and the ratio of the on-time as to the measurement period from the average of the output current over the measurement period.

Also, the power supply device may further include a consumed current measurement unit for calculating the average consumed current of the electronic device over a predetermined measurement period based upon the values of the output current and the partial current in the measurement period.

According to a second aspect of the present invention, a test apparatus for testing an electronic device comprises: a current output unit for outputting output current including at least source current to be applied to the electronic device as a component of the current thereof; a connection resistor which electrically connects the current output unit and the electronic device for supplying the source current from the current output unit to the electronic device; a low-pass filter having a cut-off frequency lower than the frequency at which the source current applied to the electronic device changes, for allowing the output voltage of the current output unit to pass through while suppressing components of frequencies higher than the cut-off frequency; a differential detection unit for detecting the electric potential difference between the output voltage of the low-pass filter and the electric potential at the device-side terminal of the connection resistor, which is closer to the electronic device; a parallel load unit which is connected to the output terminal of the current output unit in parallel with the connection resistor, and which has a function of consuming a partial current which is a part of the output current of the current output unit in a case that the electric potential difference detected by the differential detection unit is smaller than a predetermined value, and which has a function of stopping reception of the partial current from the current output unit in a case that the electric potential difference detected by the differential detection unit has become greater than a predetermined value; a pattern generating unit for generating a test pattern to be input to the electronic device; a signal input unit for supplying the test pattern to the electronic device which receives the source current; and a determination unit for determining the acceptability of the electronic device based upon the signal output from the electronic device in response to the test pattern.

With a power supply voltage stabilizing device for stabilizing the source voltage of a power supply device for supplying source current to an electronic device according to a third aspect of the present invention, the power supply device includes: a current output unit for outputting output current including at least the source current as a component of the current thereof; and a connection resistor which electrically connects the current output unit and the electronic device for supplying the source current from the current output unit to the electronic device. Furthermore, the power supply voltage stabilizing device includes: a low-pass filter having a cut-off frequency lower than the frequency at which the source current applied to the electronic device changes, for allowing the output voltage of the current output unit to pass through while suppressing components of frequencies higher than the cut-off frequency; a differential detection unit for detecting the electric potential difference between the output voltage of the low-pass filter and the electric potential at the device-side terminal of the connection resistor, which is closer to the electronic device; and a parallel load unit which is connected to the output terminal of the current output unit in parallel with the connection resistor, and which has a function of consuming a partial current which is a part of the output current of the current output unit in a case that the electric potential difference detected by the differential detection unit is smaller than a predetermined value, and which has a function of stopping reception of the partial current from the current output unit in a case that the electric potential difference detected by the differential detection unit has become greater than a predetermined value.

Note that the summary of the present invention described above is not a precise list including all the features required for the present invention Also, various sub-combinations of the aforementioned features are also encompassed in the present invention.

According to the present invention, the electronic device can be tested at high accuracy.

DETAILED DESCRIPTION OF THE INVENTION

Description will be made below regarding the present invention with reference to the following embodiments. It should be understood that the present invention within the scope of the appended claims is not intended to be limited to the embodiments described below. Furthermore, all the combinations of the features described in the embodiments are not necessarily indispensable to the solving means of the present invention.

Figure 1:
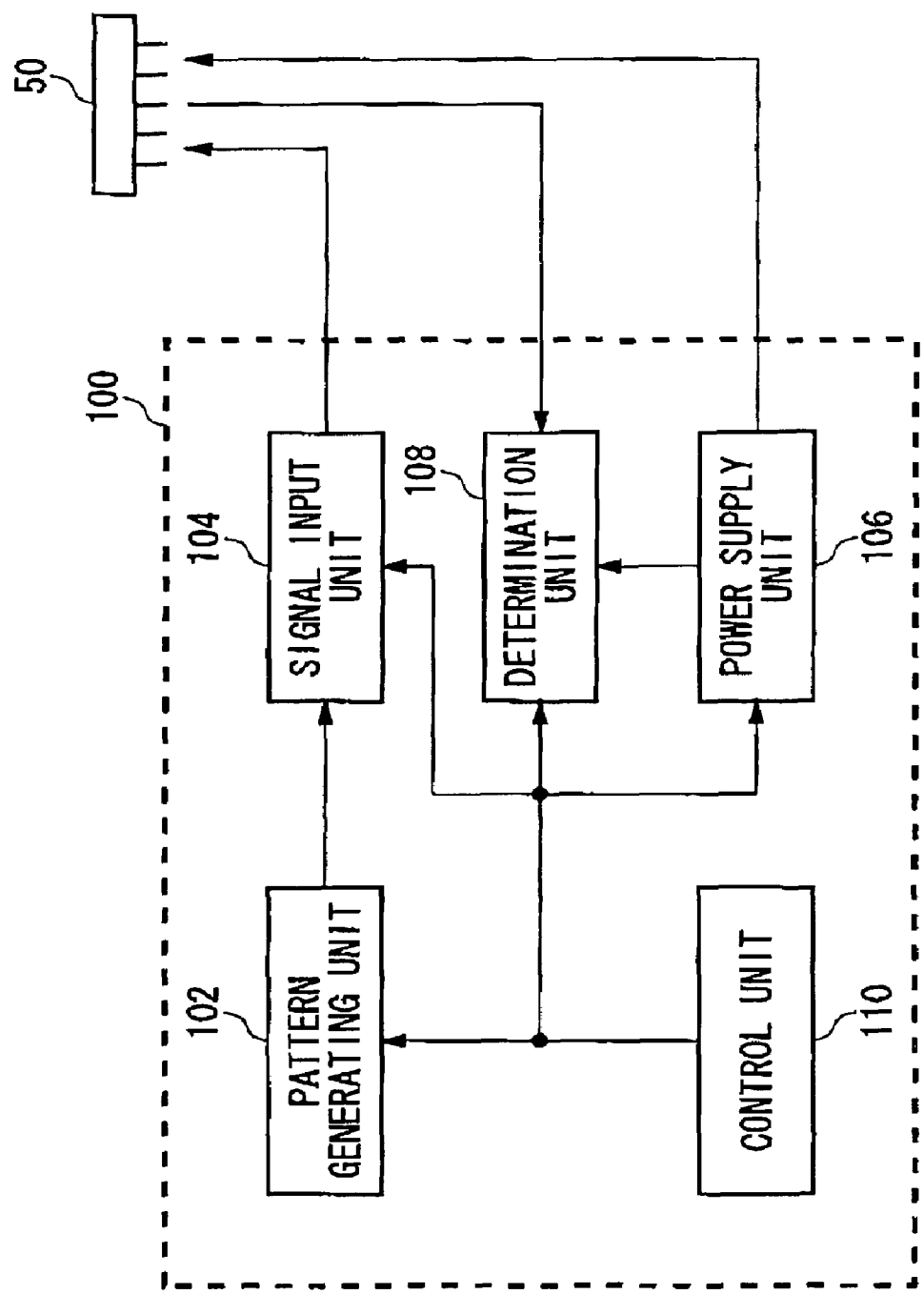
FIG. 1 is a diagram which shows an example of the configuration of a test apparatus 100 according to an embodiment of the present invention.

FIG. 1 shows an example of a configuration of a test apparatus 100 with an electronic device 50 according to an embodiment of the present invention. The electronic device 50 is a device under test (DUT) such as an LSI or the like. It is an object of the test apparatus 100 according to the present embodiment to provide a high-precision test of the electronic device 50. The test apparatus 100 includes a control unit 110, a power supply unit 106, a pattern generating unit 102, a signal input unit 104, and a determination unit 108. The generating unit 110 controls the power supply unit 106, the pattern generating unit 102, the signal input unit 104, and the determination unit 108.

The power supply unit 106 is a power supply device for supplying source current to the electronic device 50. Furthermore, with the present embodiment, the power supply unit 106 measures the magnitude of the source current supplied to the electronic device 50, and notifies the determination unit 108 of the measurement results.

The pattern generating unit 102 generates a test pattern to be input to the electronic device 50, and supplies the test pattern to the signal input unit 104. The signal input unit 104 supplies the test pattern to the electronic device 50, which receives the source current from the power supply device 106, according to a predetermined timing, e.g., with a predetermined delay time.

The determination unit 108 determines the acceptability of the electronic device 50 based upon the signal output from the electronic device 50 in response to the test pattern. Furthermore, with the present embodiment, the determination unit 108 determines the acceptability of the electronic device 50 based upon the magnitude of the source current supplied to the electronic device 50 from the power supply unit 106. The determination unit 108 may have a function as a source current calculation unit for calculating the source current. The present embodiment provides an appropriate test of the electronic device 50. The test apparatus 100 may have a function as a current measurement device for measuring the source current received by the electronic device 50.

Figure 2:
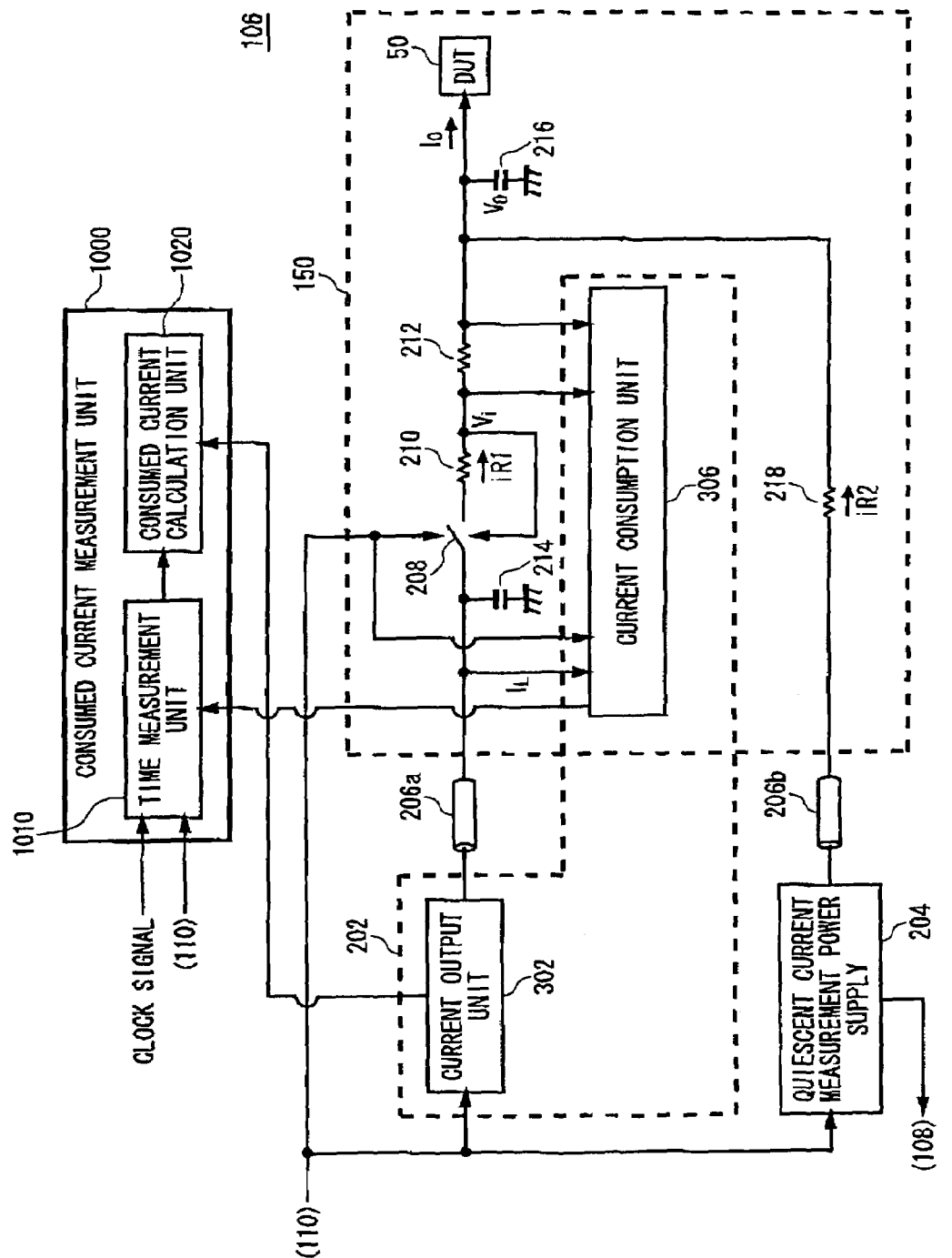
FIG. 2 is the diagram which shows an example of the configuration of a power supply unit 106.

FIG. 2 shows an example of a configuration of the power supply unit 106 with the electronic device 50. The power supply unit 106 includes a large-current power supply 202, an quiescent current measurement power supply 204, multiple connection lines 206a and 206b, multiple capacitors 214 and 216, a switch 208, and multiple resistors 210, 212, and 218. On the other hand, with the present embodiment, the electronic device 50 receives the terminal voltage Vo of the capacitor 216 as the source voltage.

With the present embodiment, a current consumption unit 306 which is a component of the large-current power supply 202, the multiple capacitors 214 and 216, the switch 208, and the multiple resistors 210, 212, and 218 are provided on a user interface 150. The user interface 150 represents an example of a printed wiring board on which wiring is formed for electrically connecting a current output unit 302 and the electronic device 50. For example, a performance board for mounting the electronic device 50 is employed. Note that the test apparatus 100 may provide a test of the electronic device 50, which is formed in the shape of a wafer. In this case, the electronic device 50 is connected to the user interface 150 through a probe card, for example.

The large-current power supply 202 is an example of a first current supply unit, and includes the current output unit 302 and the current consumption unit 306. The current output unit 302 is a device power supply for supplying electric power to the electronic device 50. For example, the current output unit 302 supplies a first current iR1, which is at least a part of the output current, to the electronic device 50 through the connection line 206a, the switch 208, the resistors 210 and 212, according to instructions from the control unit 110. With the present embodiment, the first current iR1 is a part of the source current Io to be supplied to the electronic device 50.

The current consumption unit 306 is an example of a source current stabilizing device according to the present invention, which has a function of stabilizing the source voltage to be supplied to the electronic device 50 from the power supply unit 106. In order to stabilize the source voltage, the current consumption unit 306 applies a partial current IL, which is a part of the output current from the current output unit 302, to a path provided in parallel with the electronic device 50 for current consumption according to instructions of the control unit 110, for example. With such a configuration, the large-current power supply 202 supplies the first current iR1, which is a part of the output current but without the partial current IL, to the electronic device 50.

Furthermore, the current consumption unit 306 has a function of detecting reduction in the terminal voltage Vo of the capacitance 216 by monitoring the terminal voltage of the resistor 212. In a case of detection of the reduced terminal voltage Vo, the current consumption unit 306 stops consumption of the partial current IL. In this case, the large-current power supply 202 supplies the first current iR1 of approximately all the output current to the electronic device 50, thereby increasing the first current iR1. Thus, the large-current power supply 202 increases the terminal voltage Vo. Thus, the present embodiment maintains the stable terminal voltage Vo of the capacitor 216. Furthermore, this enables a high-precision test of the electronic device 50 which receives the terminal voltage Vo as the source voltage.

The quiescent current measurement power supply 204 is an example of a second current supply unit for supplying a second current iR2, which is smaller than the first current iR1, to the electronic device 50 through the resistor 218 provided in parallel with the switch 208. Furthermore, with the present embodiment, the quiescent current measurement power supply 204 notifies the determination unit 108 of the magnitude of the second current iR2 thus output.

The multiple connection lines 206a and 206b are coaxial cables, for example. The connection line 206a electrically connects the current output unit 302 and the user interface 150. The connection line 206b electrically connects the quiescent current measurement power supply 204 and the user interface. With the present embodiment, the connection line 206a electrically connects the current output unit 302 and the switch 208. The connection line 206b electrically connects the quiescent current measurement power supply 204 and the resistor 218.

The capacitor 214 is an example of a smoothing capacitor. One terminal of the capacitor 214 is connected to the current output unit 302 through the connection line 206. The other terminal is grounded with such a configuration, the capacitor 214 smoothes out the first current iR1 output from the current output unit 302. Furthermore, the one terminal of the capacitor 214 is electrically connected to the resistor 212 through the switch 208 and the resistor 210. The capacitor 214 smoothes out the first current iR1 which is a part of the source current Io. This smoothes out the source current Io in the current direction upstream of the resistor 212.

The capacitor 216 is an example of a device-side capacitor, and has a smaller electrostatic capacitance than that of the capacitor 214. Furthermore, with regard to the capacitor 216, one terminal is connected to the electronic device 50. The other terminal is grounded. Furthermore, the one terminal of the capacitor 216 is electrically grounded through the resistors 212 and 210, and the switch 208. With such a configuration, the capacitor 216 smoothes out the first current iR1 in the current direction downstream of the resistor 212. The capacitor 216 may smoothes out the source current Io to be supplied to the electronic device 50 from the resistor 212.

The switch 208 is provided in series with the resistor 212 between the capacitor 214 and the resistor 210. Upon turning on the switch 208, the first current iR1 flows from the capacitor 214 to the capacitor 216 through the resistors 210 and 212. With the present embodiment, the switch 208 is turned on/off according to instructions of the control unit 110. Furthermore, in a case that the voltage between both terminals of the resistor 210 is greater than a predetermined value, the switch 208 is turned on so that the first current iR1 flows, regardless of instructions of the control unit. This prevents excessive reduction in the terminal voltage Vo of the capacitor 216.

The resistor 210 is an example of a first resistor, and is connected in series with the switch 208. With such a configuration, the resistor 210 regulates the output current of the large-current power supply 202 so as to output the first current iR1. Furthermore, the resistor 210 is electrically connected to the capacitor 216 through the resistor 212. With such a configuration, one terminal of the capacitor 216 is electrically connected to the switch 208. Furthermore, with such a configuration, the resistor 210 electrically connects the one terminal of the capacitor 214 and the one terminal of the capacitor 216. Upon turning on the switch 208, the first current flows from the capacitor 214 to the capacitor 216.

The resistor 212 is an example of a connection resistor, and is provided in series with the resistor 210, between the resistor 210 and the electronic device 50. With such a configuration, the resistor 212 electrically connects the current output unit 302 and the electronic device 50. Thus, the resistor 212 supplies the first current iR1, received from the switch 208, to the electronic device 50 through the resistor 210. The resistor 212 may supplies the first current iR1, received from the current output unit 302, to the electronic device 50 as at least a part of the source current Io.

Furthermore, the voltage between both terminals of the resistor 212 due to the first current is applied to the current consumption unit 306 with such a configuration, the resistor 212 is not used for detecting the absolute value of the current flowing through the resistor 212, but is used for detecting reduction in the terminal voltage Vo of the capacitor 216. Accordingly, a pattern resistor formed in the user interface 150 may be employed as the resistor 212. The resistor 212 may have an electric resistance of around 5 mΩ. For example, the resistor 212 may be formed of a copper pattern with a thickness of 35 μm, with a pattern width of 10 mm, and with a pattern length of around 10 cm.

The resistor 218 is an example of a second resistor. One terminal of the resistor 218 is electrically connected to one terminal of the capacitor 216. The other terminal is electrically connected to the quiescent current measurement power supply 204 through the connection line 206b. With such a configuration, the resistor 218 electrically connects the quiescent current measurement power supply 204 and one terminal of capacitor 216. Furthermore, the resistor 218 has a larger electric resistance than that of the resistor 210. Thus, the quiescent current measurement power supply 204 outputs the second current iR2, which is smaller than the first current iR1, through the resistor 218. The present embodiment allows proper supply of the source current Io to the electronic device 50.

More detailed description will be made below regarding the operation of the power supply unit 106 and the determination unit 108. With the present embodiment, in a case of a functional test of the electronic device 50, for example, the switch 208 is turned on. In this case, the power supply unit 106 supplies the sum of the first current iR1 and the second current iR2 to the electronic device 50, as the source current Io.

In this case, the large-current power supply 202 and the quiescent current measurement power supply 204 supply the first current iR1 and the second current iR2 to the electronic device 50 with a ratio corresponding to the ratio between the electric resistances of the resistor 210 and the resistor 218. The determination unit 108 may calculate the magnitude of the first current iR1 based upon the magnitude of the second current iR2, which is the information received from the quiescent current measurement power supply 204, and the ratio between the aforementioned electric resistances. Thus, in a case of turning on the switch 208, the determination unit 108 calculates the source current Io received by the electronic device 50, based upon the ratio between the electronic resistances of the resistors 210 and 218, and the second current iR2 output from the quiescent current measurement power supply 204. The determination unit 108 may calculate the source current Io received by the electronic device 50 during the functional test.

Let us say that the magnitude of the first current iR1 is calculated based upon the current output from the large-current power supply 202. In some cases, such calculation leads to an error due to the electrostatic capacitance of the capacitor 214.

With the present embodiment, the quiescent current measurement power supply 204 supplies the second current iR2 to the electronic device 50 through the capacitor 214 which does not have a large electrostatic capacitance. This allows the quiescent current measurement power supply 204 to detect the second current iR2 with high precision. The quiescent current measurement power supply 204 notifies the determination unit 108 of the detection results. Thus, the present embodiment provides high-precision calculation of the source current Io of the electronic device 50.

On the other hand, in a case of quiescent current test (Iddq test) of the electronic device 50, for example, the switch 208 is turned off. In this case, the power supply unit 106 supplies the second current iR2 to the electronic device 50, as the source current Io. Accordingly, in a case of turning off the switch 208, the determination unit 108 calculates the source current Io with the second current iR2 output from the quiescent current measurement power supply 204 as the source current Io received by the electronic device 50. Thus, the determination unit 108 calculates the source current Io based upon the second current iR2 output from the quiescent current measurement power supply 204. Furthermore, the determination unit 108 may determine the acceptability of the electronic device 50 based upon the source current Io thus calculated. The present embodiment provides a high-precision test of the electronic device 50.

Let us consider an arrangement in which the capacitors 214 and 216 for smoothing the source current Io are replaced by a single capacitor. Furthermore, let us say that the single capacitor has a small capacitance. Such an arrangement leads to large change in the terminal voltage of the capacitor due to change in the source current Io. In some cases, this leads to unstable source voltage being applied to the electronic device 50. On the other hand, let us say that the single capacitor has a large capacitance. Such an arrangement leads to excessive recovery time after change in the terminal voltage of the capacitor, resulting in difficulty maintaining a proper source voltage being applied to the electronic device 50.

However, the present embodiment has a configuration including the capacitor 216 provided at a position near the electronic device 50 for smoothing the source current Io, and the capacitor 214 for smoothing the large first current iR1 applied in a case of a functional test, for example. Such a configuration reduces change in the source voltage due to change in the source current Io occurring in the functional test, for example. Furthermore, with the present embodiment, in a case of quiescent current measurement and so forth, the switch 208 is turned off, for example. This enables high-precision measurement of the source current Io.

Let us say that the source voltage of the electronic device 50 is 2V with a permissible range of change thereof of 5%. In this case, there is the need to suppress the change in the source voltage within around 50 mV giving consideration to a margin of around 0.5. In this case, let us say that the functional test is performed with a function rate of 10 nsec, with a peak current of 1 A, and with a peak-current duration of 4 nsec. Furthermore, let us say that the response time required for changing the output current of the large-current power supply 202 is 5 μsec. In this case, the capacitor 214 may have an electrostatic capacitance of 40 μF, which is obtained from the expression (0.4 A×5 μsec)/50 mV. On the other hand, the capacitor 216 may have an electrostatic capacitance of around ⅒ or less of that of the capacitor 214, based upon the ratio between the first current iR1 and the second current iR2, for example.

Also, the large-current power supply 202 may output the first current iR1 approximately inversely proportional to the sum of the on-resistance of the switch 208 and the electric resistance of the resistor 210. The quiescent current measurement power supply 204 may output the second current iR2 approximately inversely proportional to the electric resistance of the resistor 218.

The ratio of the electric resistance of the resistor 218 as to the sum of the on-resistance of the switch 208 and the electric resistance of the resistor 210 is determined beforehand based upon the measurement range of the source current Io, for example. The sum of the on-resistance of the switch 208 and the electric resistance 210 may be around ⅒ or more of the electric resistance of the resistor 218, for example. With such a configuration, the quiescent current measurement power supply 204 outputs the second current iR2 which is around ⅒ or less the voltage of the first current iR1. Let us say that the quiescent current test is performed with the maximum value of the source current Io of around 10 mA. With the present embodiment, in this case, the switch 208 is switched from the on-state to the off-state. In order to suppress the change in voltage due to such switching action to around 50 mV, the resistor 218 may have an electric resistance of around 5 Ω, which is calculated from the expression 50 mV/10 mA.

Furthermore, the power supply unit 106 may further include a consumption current measurement unit 1000 for measuring the source current Io supplied to and consumed by the electronic device 50 during the functional test of the electronic device 50. In a case that the consumption current measurement unit 1000 measures the source current Io consumed by the electronic device 50, the control unit 110 stops output of the second current iR2 from the quiescent current measurement power supply 204.

The power supply unit 106 according to the present embodiment calculates the average consumed current of the electronic device 50 over a predetermined measurement period in the functional test based upon the output current of the current output unit 302 during the measurement period, for example. Here, the power supply unit 106 may calculate the average consumed current of the electronic device 50 further based upon the value of the partial current IL during the measurement period.

The consumed current measurement unit 1000 includes a time measurement unit 1010 and a consumed current calculation unit 1020. The time measurement unit 1010 measures the period of time in which the current consumption unit 306 consumes the partial current IL, or the period of time until which the current consumption unit 306 has stopped consumption of the partial current IL. The consumed current calculation unit 1020 calculates and displays the average consumed current of the electronic device 50 over the measurement period based upon the period of time in which the current consumption unit 306 has consumed the partial current IL or the period of time until which the current consumption unit 306 has stopped consumption of the partial current IL, which has been measured by the time measurement unit 1010, and the current value of the output current from the current output unit 302. Furthermore, as to its measurement period, the consumed current calculation unit 1020 displays the ratio of the period of time in which the current consumption unit 306 has consumed the partial current IL or the period of time until which the current consumption unit 306 has stopped consumption of the partial current IL.

Figure 3:
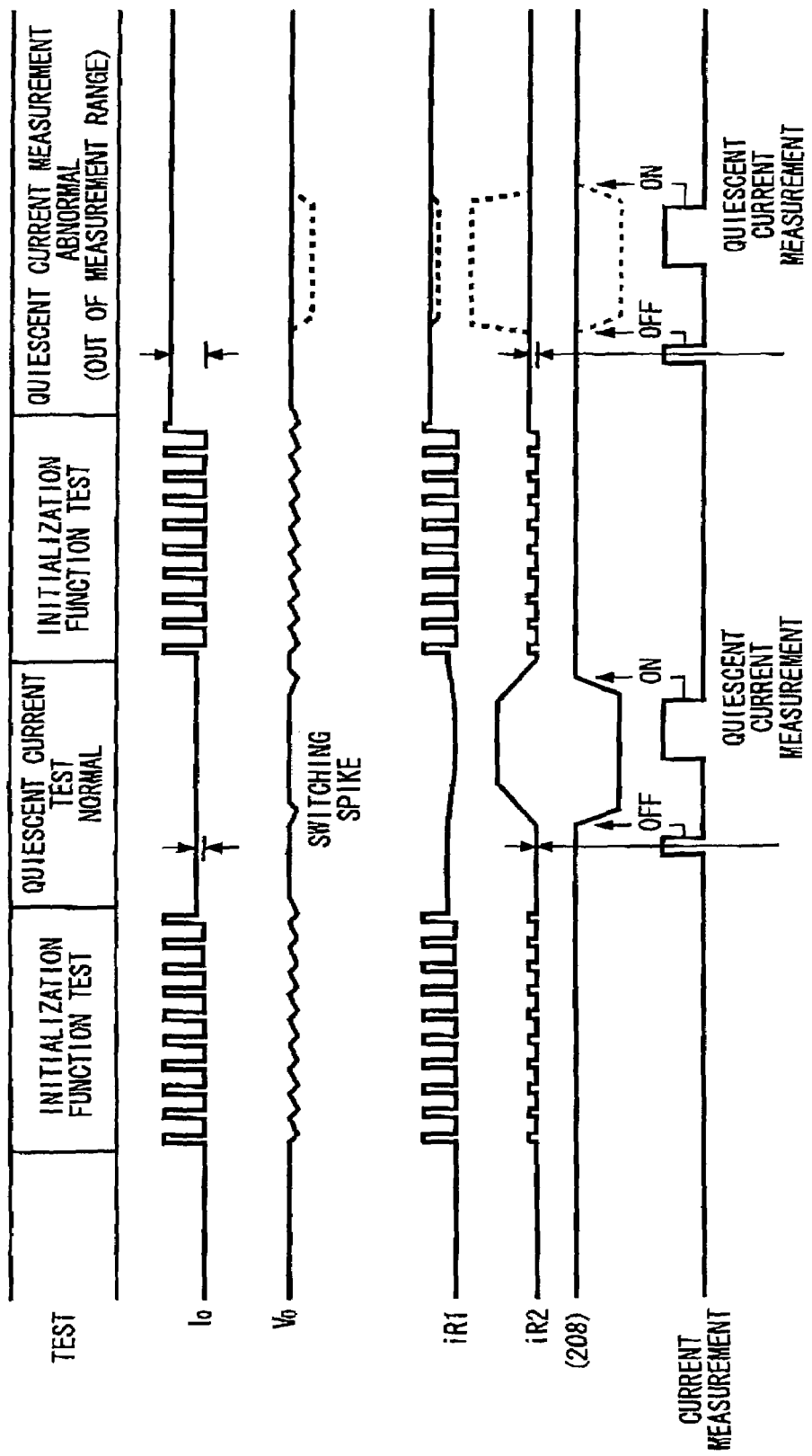
FIG. 3 is a timing chart which shows an example of the operation of the test apparatus 100.

FIG. 3 is a timing chart which shows an example of the operation of the test apparatus 100. In the present example, the test apparatus 100 performs initialization and/or the functional test, and the quiescent current test. In the present example, the test apparatus 100 measures the quiescent current after the measurement in which the large source current Io is applied to the electronic device 50. Furthermore, the test apparatus 100 performs initialization and/or the functional test, and the quiescent current test again, after the quiescent test thus performed.

In the stage of the initialization and/or the functional test, the switch 208 is turned on. Thus, the electronic device so receives the first current iR2 and the second current iR2, which is around 1/10 of the first current iR2, as the source current Io. Note that the source current Io received by the electronic device 50 is changed synchronously with a clock signal, for example. With such an arrangement, the terminal voltage Vo of the capacitor 216 changes synchronously with the source current Io and in a manner inversely correlated with change in the source current Io.

Then, in the quiescent current measurement, the determination unit 108 measures the source current Io prior to switching of the switch 208. In a case that the source current Io is within a predetermined range (normal range), the control unit 110 turns off the switch 208 so as to stop the first current iR1. In this case, the electronic device 50 receives the second current iR2 as the source current Io. Then, the determination unit 108 measures the source current Io of the electronic device 50, following which the control unit 110 turns on the switch 208 again. Thus, with regard to the test apparatus 100, the quiescent current test ends.

Then, the test apparatus 100 performs the initialization and/or the functional test, following which the test apparatus 100 starts the next quiescent current test. In this measurement, the determination unit 108 also measures the source current Io before the control unit 110 turns off the switch 208. In this measurement, in a case that the source current Io deviates from a predetermined range (abnormal state) such as a case of the source current Io exceeding a predetermined value, the control unit 110 maintains the on-state of the switch 208. As a result, in this case, the electronic device 50 receives the first current iR1 and the second current iR2 as the source current Io in the same way as with the previous step.

Such an arrangement provides a proper quiescent current test even in a case that the electronic device 50 requires a quiescent current greater than the current supply capability of the quiescent current measurement power supply 204.

Note that an arrangement may be made in which the measurement of the source current Io is not performed prior to the quiescent current test, and the switch 208 is turned off without conditions as indicated by the dashed lines in the drawings. With such an arrangement, in a case of an abnormal source current Io, the voltage between both terminals of the resistor 210 increases due to reduction in the terminal voltage Vo of the capacitor 216. Accordingly, the switch 208 allows the first current iR1 to flow therethrough, regardless of instructions of the control unit. Thus, such an arrangement provides a proper source current Io to the electronic device 50.

Figure 4:
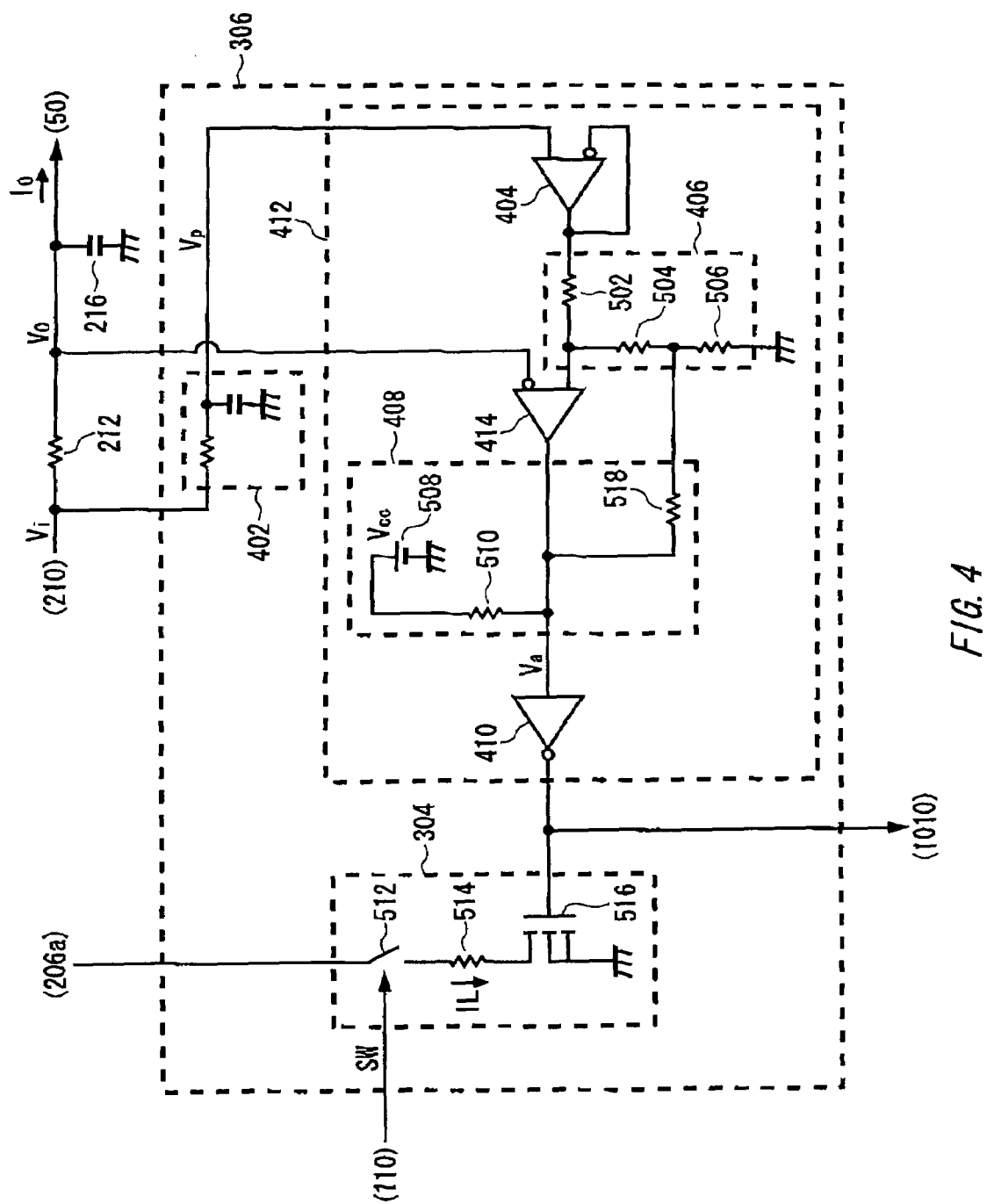
FIG. 4 is a diagram which shows an example of the configuration of a current consumption unit 306 in detail.

FIG. 4 shows an example of a configuration of the current consumption unit 306 in detail. The current consumption unit 306 according to the present embodiment includes a low-pass filter 402, a differential detection unit 412, and a parallel load unit 304. The low-pass filter 402, the differential detection unit 412, and the parallel load unit 304 may be provided on the user interface 150 (see FIG. 2).

The low-pass filter 402 includes a resistor and a capacitor. The aforementioned resistor connects the power-supply-side end of the resistor 212, which is on the near side of the resistor 210, and one terminal of the aforementioned capacitor. Furthermore, the other terminal of the capacitor is grounded. With such a configuration, the low-pass filter receives the output voltage of the current output unit 302 (see FIG. 2) through the resistor 210, and reduces the high-frequency component thereof. Then, the low-pass filter 402 supplies the output voltage to the differential detection unit 412.

Note that the low-pass filter 402 preferably has a lower cut-off frequency than the frequency with which the source current Io received by the electronic device 50 changes. With such a configuration, the low-pass filter 402 allows the output voltage of the current output unit 302 to pass through while suppressing components thereof at higher frequencies than the cut-off frequency. Specifically, with the present embodiment, the low-pass filter 402 receives the voltage Vi at the power-supply end of the resistor 212 as the output voltage of the current output unit 302, and reduces the high-frequency component thereof. The low-pass filter 402 supplies the voltage Vi, of which the high-frequency component has been reduced, to the differential detection unit 412.

The differential detection unit 412 includes a voltage follower 404, a reference voltage output unit 406, a comparison unit 414, a reference voltage setting unit 408, and a load driving unit 410. An op-amp in which the output is used as a negative feedback signal is employed as the voltage follower 404. The voltage follower 404 receives the output voltage of the low-pass filter 402 in the form of a positive input, and supplies the same voltage as this output voltage to the reference voltage output unit 406.

The reference voltage output unit 406 includes multiple resistors 502, 504, and 506 in series between the output of the voltage follower 404 and the grounded electrode. The reference voltage output unit 406 outputs the voltage at the node between the resistors 502 and 504 as the reference voltage to be applied to the comparison unit 414. Thus, the reference voltage output unit 406 outputs the reference voltage obtained by dividing the output voltage of the low-pass filter 402 with the electric-resistance ratio between the multiple resistors 502, 504, and 506.

Furthermore, the reference voltage output unit 406 receives the output of the reference voltage setting unit 408 through the node between the resistors 504 and 506. With such a configuration, the reference voltage output unit 406 outputs a first reference voltage or the second reference voltage, depending upon the output of the reference voltage setting unit 408.

The comparison unit 414 receives the reference voltage output from the reference voltage output unit 406 as positive input, and receives the electric potential at the device-side end of the resistor 212, which is on the side closer to the electronic device, as negative input. With such a configuration, the comparison unit 414 makes a comparison between the aforementioned reference voltage and the electric potential at the device-side end of the resistor 212. With such a configuration, the differential detection unit 412 receives the output voltage of the low-pass filter 402 through the voltage follower 404 and the reference voltage output unit 406. Thus, the differential detection unit 412 may detect the electric potential difference between the output voltage of the low-pass filter 402 and the electric potential at the device-side end of the resistor 212. Then, the comparison unit 414 transmits the comparison results to the reference voltage setting unit 408 in the form of collector open output, for example. For example, in a case that the electric potential of the positive input is greater than the electric potential of the negative input, the output of the comparison unit 414 is opened. On the other hand, in a case that the electric potential of the positive input is smaller than the electric potential of the negative input, the output of the comparison unit 414 is grounded.

Note that with the present embodiment, the device-side end of the resistor 212 is connected to one terminal of capacitor 216. Accordingly, the electric potential of the device-side end of the resistor 212 is the same as the terminal voltage Vo of the capacitor 216. The comparison unit 414 may make a comparison between the output voltage of the low-pass filter 402 and the terminal voltage Vo.

The reference voltage setting unit 408 includes a constant-voltage source 508 and multiple resistors 510 and 518. The constant-voltage source 508 outputs a predetermined voltage Vcc. The resistor 510 connects the positive electrode of the constant-voltage source 508 and the output terminal of the comparison unit 414. The resistor 518 connects the output terminal of the comparison unit 414 and the upstream terminal of the resistor 506 included in the reference voltage output unit 406.

With such a configuration, in a case that the terminal voltage Vo is smaller than the reference voltage, the output of the comparison unit 414 is opened. Accordingly, in the reference voltage setting unit 408, the output voltage Vcc of the constant-voltage source 508 is applied to the upstream terminal of the resistor 506 through the multiple resistors 510 and 518. In this case, the reference voltage output unit 406 outputs the first reference voltage determined based upon the output of the voltage follower 404, the electric-resistance ratio between the multiple resistors 502, 504, 506, 510, and 518, and the output voltage Vcc of the constant-voltage source 508.

On the other hand, in a case that the terminal voltage Vo is greater than the reference voltage, the output of the comparison unit 414 is grounded. Accordingly, with the reference voltage setting unit 408, the upstream terminal of the resistor 506 is grounded through the resistor 518. In this case, the electric potential of the upstream terminal of the resistor 506 is reduced, Accordingly, the reference voltage output unit 406 outputs the second reference voltage which is smaller than the first reference voltage and which is determined based upon the output of the voltage follower 404, and the electric-resistance ratio between the multiple resistors 502, 504, 506, and 518.

Thus, in a case that the terminal voltage Vo of the capacitor 216 is greater than the first reference voltage, the reference voltage setting unit 408 controls the reference voltage output unit 406 so as to output the second reference voltage according to the output of the comparison unit 414. On the other hand, in a case that the terminal voltage Vo is smaller than the second reference voltage, the reference voltage setting unit 408 controls the reference voltage output unit 406 so as to output the first reference voltage. The reference voltage output unit 406 outputs the reference voltage which changes according to the output of the reference voltage setting unit while being affected by hysteresis.

Furthermore, with the reference voltage setting unit 408, the electric potential Va at the node between the resistors 510 and 518 is applied to the load driving unit 410. Thus, in a case that the terminal voltage Vo of the capacitor 216 is smaller than the reference voltage output from the reference voltage output unit 406, the reference voltage setting unit 408 provides an H signal to the load driving unit 410 according to the output of the comparison unit 414. On the other hand, in a case that the terminal voltage Vo is greater than the reference voltage, the reference voltage setting unit 408 provides an L signal to the load driving unit 410. Thus, the reference voltage setting unit 408 provides the output of the comparison unit 414, to the load driving unit 410.

The load driving unit 410 is an inverting circuit, for example. The load driving unit 410 inverts the output of the comparison unit 414, which has been received through the reference voltage setting unit 408, and provides the inverted signal to the parallel load unit 304. Thus, the load driving unit 410 provides a signal to the parallel load unit 304 corresponding to the comparison result between the terminal voltage Vo of the capacitor 216 and the reference voltage. With the present embodiment, in a case that the terminal voltage Vo is greater than the reference voltage, the load driving unit 410 outputs an H signal. On the other hand, in a case that the terminal voltage Vo is smaller than the reference voltage, the load driving unit 410 outputs an L signal. Thus, the differential detection unit 412 detects the electric potential difference between the output voltage of the low-pass filter 402 and the terminal voltage Vo of the capacitor 216, and notifies the parallel load unit 304 of the detection results.

Furthermore, the output of the load driving unit 410 is supplied to the time measurement unit 1010. The load driving unit 410 measures the period of time in which the power consumption unit 306 has consumed the partial current IL, or the period of time until which the power consumption unit 306 has stopped consumption of the partial current IL, using the signal output from the load driving unit 410.

The parallel load unit 304 includes a low-speed switch 512, a resistor 514, and a high-speed switch 516. The low-speed switch 512 is an switch which performs opening/closing actions at a lower speed than the response speed of the current output unit 302. Upon connecting one terminal of the low-speed switch 512 to the connection line 206a, the parallel load unit 304 is connected in parallel with the resistor 212. In this case, the parallel load unit 304 is connected to the output terminal of the current output unit 302 in parallel with the resistor 212. Note that the low-speed switch 512 is opened/closed according to instructions of the control unit 110, for example. Here, the response speed of the current output unit 302 represents the speed with which the output current from the current output unit 302 changes in response to change in the source current Io received by the electronic device 50, for example. A semiconductor switch such as a MOSFET and so forth may be employed as the low-speed switch 512, for example. With such a configuration, the low-speed switch 512 may receive the output SW from the control unit 110 through a resistor, for example.

The resistor 514 is connected to the downstream terminal of the low-speed switch 512 in series. With such a configuration, the resistor 514 consumes the current received from the current output unit 302 through the high-speed switch 516.

An N-type MOSFET is employed as the high-speed switch 516. The high-speed switch 516 is connected to the downstream terminal of the resistor 514 in series, with the gate terminal connected so as to receive the output of the load driving unit 410. With such a configuration, the high-speed switch 516 performs opening/closing actions according to the output of the differential detection unit 412. Note that the high-speed switch 516 has a function of opening/closing actions with a higher speed than the response speed of the current output unit 302. In a case that the terminal voltage Vo of the capacitor 216 is greater than the reference voltage, the high-speed switch 516 is turned on. On the other hand, in a case that the terminal voltage Vo of the capacitor 216 is smaller than the reference voltage, the high-speed switch 516 is turned off. The high-speed switch 516 may be connected in parallel with the resistor 212, and in series with the low-speed switch 512.

With such a configuration, in a case of turning on the low-speed switch 512 and the high-speed switch 516, the partial current IL, which is a part of the output current of the current output unit 302, flows through the resistor 514. The parallel load unit 304 consumes the partial current IL. On the other hand, in a case of turning off the high-speed switch 516, the parallel load unit 304 stops consumption of the partial current IL. Accordingly, in a case of reduction in the terminal voltage Vo, the current consumption unit 306 increases the current which flows through the resistor 212. In this case, the current consumption unit 306 increases the terminal voltage Vo. Thus, the present embodiment has the advantage of maintaining the stable source voltage applied to the electronic device 50.

Let us consider an arrangement in which the output current of the current output unit 302 is supplied to the electronic device 50 without using the current consumption unit 306, for example. In some cases, such an arrangement leads to a problem of great change in the terminal voltage Vo of the capacitor 216 due to change in the source current Io of the electronic device 50. For example, in a case of temporary increase in the source current Io, in some cases, the terminal voltage Vo is greatly reduced due to undershooting. On the other hand, in a case of temporary reduction in the source current Io, in some cases, the terminal voltage Vo is greatly increased due to overshooting. This leads to unstable source voltage applied to the electronic device 50. In some case, this leads to difficulty in performing a proper test. In addition, improved fine processing technology in recent years involves the reduced voltage endurance of the gate of the MOSFET. Accordingly, in some cases, overshooting of the source voltage leads to a problem from the perspective of the voltage endurance of the gate.

The present embodiment employing the current consumption unit 306 properly controls the current, which flows from the current output unit 302 to the capacitor 216, corresponding to change in the source current Io of the electronic device 50. Thus, the present embodiment has the advantage of maintaining the stable source voltage applied to the electronic device 50.

Furthermore, the test apparatus requires a great number of connection lines 206. Accordingly, in some cases, there is a difficulty in designing the test apparatus with a sufficient line width of the connection lines 206 due to practical limits on the design thereof. Furthermore, in some cases, there is a difficulty in designing the test apparatus with the current output unit 302 provided near the electronic device 50. In order to solve such problems, let us consider an arrangement in which the output voltage of the current output unit 302 is corrected using the terminal voltage Vo of the capacitor 216 as a feedback signal, for example. However, such an arrangement has a limit with respect to the response speed of the current output unit 302 due to the inductance of the connection line 206, for example. On the other hand, the present embodiment has the advantage of proper and high-speed adjustment of the current to be applied to the capacitor 216 by switching the high-speed switch 516 between the on-state and the off-state.

On the other hand, in some cases, the source voltage to be applied to the electronic device 50 is different for each test item, the kind of the electronic device 50, and so forth, for example. In this case, there is the need to adjust the reference voltage to be applied to the comparison unit 414 following the source voltage to be applied to the electronic device 50. Let us consider an arrangement in which a device power supply other than the current output unit 302 provides the reference voltage. In some cases, such an arrangement has a problem of insufficient precision due to errors which arise from the combination of the device power supply and the test apparatus or the user interface, for example. Furthermore, let us consider an arrangement further including a correction circuit for correcting such an error. However, such an arrangement has a problem of the increased circuit scale.

On the other hand, with the present embodiment, the reference voltage output unit 406 generates the reference voltage based upon the output voltage of the current output unit 302. Thus, the present embodiment has the advantage of properly generating the reference voltage for various source voltages to be applied to the electronic device 50.

Furthermore, with the present embodiment, the differential detection unit 412 receives the output voltage of the current output unit 302 through the low-pass filter 402. Such a configuration has the advantage of generating a stable reference voltage even if the electric potential Vi at the power-supply-side terminal of the resistor 212 temporarily changes due to change in the source current Io, for example. Here, let us say that the low-pass filter 402 has a cut-off frequency of around 2 kHz, and the electric potential Vi at the power-supply-side terminal changes around 100 mV. In this case, in order to suppress change in the output to around 1 mV, the low-pass filter 402 should have an attenuation of around −40 db.

In this case, the low-pass filter 402 having a single-stage RC circuit as described in the present embodiment has an attenuation of −3 db at 20 Hz. Furthermore, the time constant τ of the RC circuit is around 8 msec. Now, with such an arrangement, let us say that the source voltage to be applied to the electronic device 50 is changed, for example. In this case, the settling time, which is the time required for settling the reference voltage with a precision of around 0.1%, is around 55 msec which is calculated by the expression 6.9×τ, for example. Thus, such an arrangement has the advantage of having a short settling time which hardly affects the overall testing time.

Now, let us say that the source current Io of the electronic device 50 is 1 A, and the electrostatic capacitance of the capacitor 216 is 30 μF. In this case, the terminal voltage Vo of the capacitor 216 is reduced by 3 mV per 100 nsec. With such an arrangement, a low-cost general-purpose comparator may be employed as the comparison unit 414, for example.

Also, an arrangement may be made in which the parallel load unit 304 includes multiple resistors 514 which can be selected using switches or the like, for example. With such an arrangement, the control unit 110 may select one of the resistors 514 corresponding to the kind of the electronic device 50. Furthermore, the low-speed switch 512 and the high-speed switch 516 may be connected through the resistor 514 thus selected. Also, the parallel load unit 304 may include a constant current circuit, instead of the resistor 514, for example.

Figure 5:
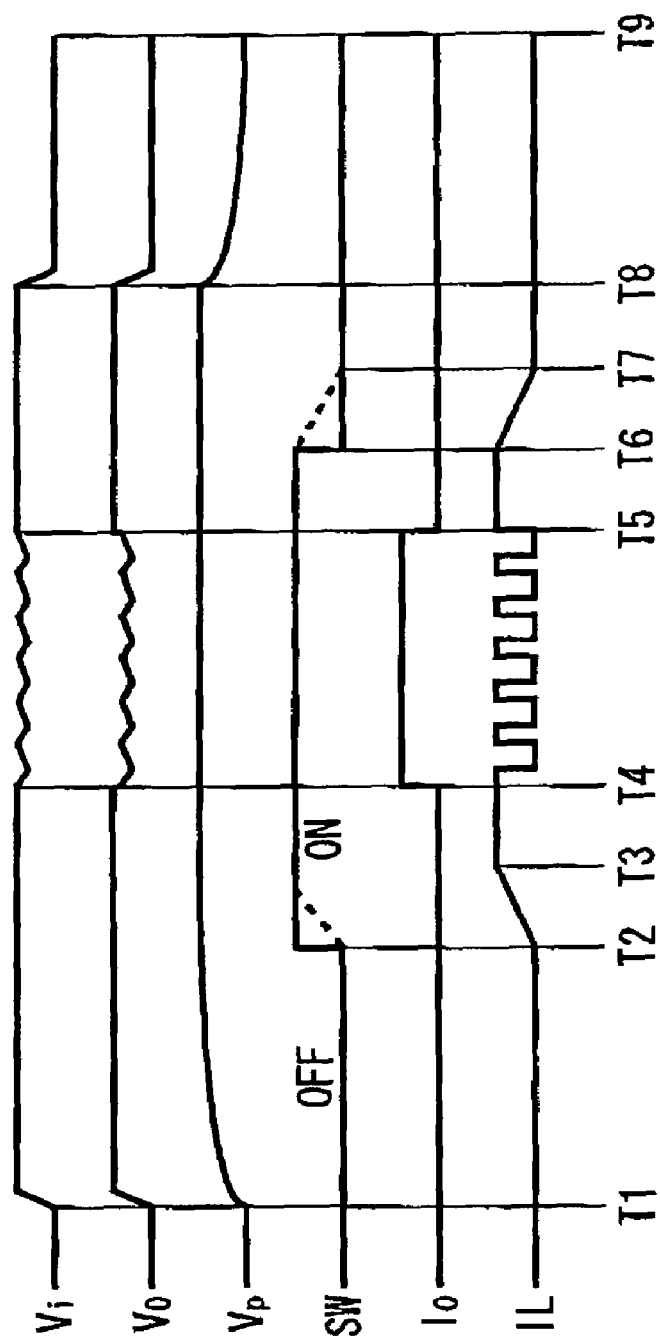
FIG. 5 is a timing chart which shows an example of the operation of the current consumption unit 306.

FIG. 5 is a timing chart which shows an example of the operation of the current consumption unit 306. With the present embodiment, the current output unit 302 starts the operation at the point in time T1, and outputs a predetermined voltage. The current consumption unit 306 starts the operation in response to the aforementioned operation. Following the output voltage Vp of the low-pass filter 402 becoming stable, the low-speed switch 512 is turned on at the point in time T2 according to change in the signal SW. Then, the parallel load unit 304 starts consumption of the partial current IL. The low-speed switch 512 may be turned on after the output voltage Vp of the low-pass filter 402 becomes approximately the same as the output voltage of the current output unit 302.

Note that an arrangement may be made in which the low-speed switch 512 receives the signal SW through a resistor. With such an arrangement, the low-speed switch is gradually turned on as indicated by the dashed lines in the drawing. Furthermore, an arrangement may be made in which the parallel load unit 304 gradually increases the partial current IL with a transition period from the point in time T2 up to the point in time T3.

Then, the test of the electronic device 50 is started after the point in time T4, i.e., after the stabilizing time of the low-speed switch 512. During the test of the electronic device 50, the terminal voltage Vo of the capacitor 216 changes due to the operation of the electronic device 50. With the present embodiment, the high-speed switch 516 performs on/off actions corresponding to the change in the terminal voltage Vo. The parallel load unit 304 consumes the partial current IL according to the on/off actions of the high-speed switch 516. Thus, the current consumption unit 306 stabilizes the source voltage applied to the electronic device 50.

After completion of the test of the electronic device 50 at the point in time T5, the low-speed switch 512 is turned off with a transition period from the point in time T6 up to the point in time T7. Subsequently, the current output unit 302 reduces the output voltage to zero after the point in time T8, i.e., after the stabilizing time of the low-speed switch 512. Then, the current consumption unit 306 stops the operation at the point in time T9 following reduction in the output voltage Vp of the low-pass filter 402 in response to the aforementioned operation of the current output unit 302. Note that the test apparatus 100 may starts the next test after the stabilizing time of the low-pass filter 402 following the end of the operation of the current consumption unit 306, for example. The present embodiment has the advantage of maintaining the stable source current Io of the electronic device 50.

Figure 6:
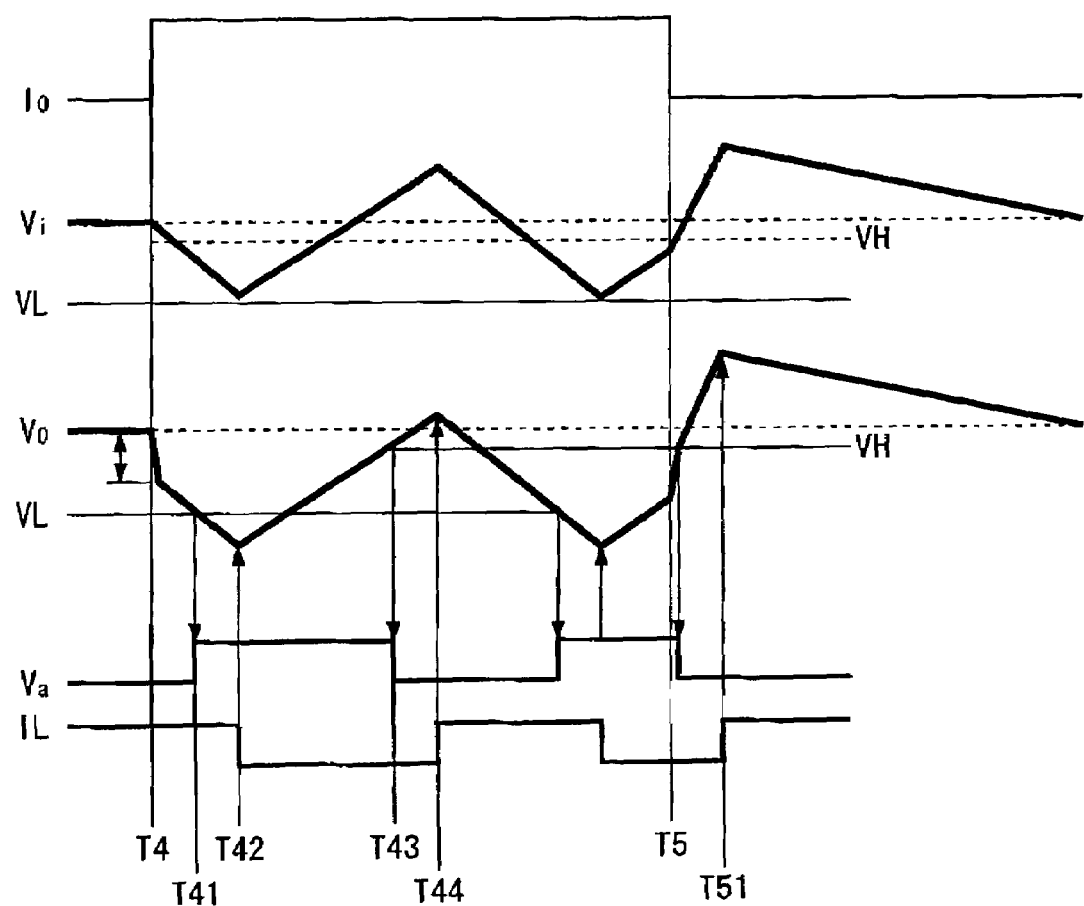
FIG. 6 is a timing chart which shows an example of the operation of the current consumption unit 306 in detail.

FIG. 6 is a timing chart which shows an example of the operation of the current consumption unit 306 over a period from the points in time T4 to T5 in detail. During this period, the terminal voltage Vo of the capacitor 216 is increased/decreased due to the actions of the electronic device 50, for example.

With the present embodiment, the reference voltage output unit 406 outputs the first reference voltage VH or the second reference voltage VL corresponding to the output Va of the comparison unit 414. In a case that the terminal voltage Vo has become smaller than the second reference voltage VL, e.g., at the point in time T41, the comparison unit 414 switches the output Va from the L signal to the H signal. Then, at the point in time T42 slightly after the point in time T41, the parallel load unit 304 stops consumption of the partial current IL according to the output of the load driving unit 410. As a result, the current flow from the current output unit 302 to the capacitor 216 increases, thereby increasing the terminal voltage Vo of the capacitor 216.

In this case, the parallel load unit 304 may stop the partial current IL flowing through the path provided in parallel with the resistor 212 over a period from the point in time at which the terminal voltage Vo has become smaller than the second reference voltage VL up to the point in time at which the terminal voltage Vo has become greater than the first reference voltage VH. Also, an arrangement may be made in which in a case that the electric potential detected by the differential detection unit 412 has become greater than a predetermined value, the parallel load unit 304 may stop reception of the partial current IL from the current output unit 302.

On the other hand, in a case that the terminal voltage Vo has becomes greater than the first reference voltage VH, e.g., at the point in time T43, the comparison unit 414 switches the output Va from the H signal to the L signal. Then, at the point in time T44 slightly after the point in time T43, the parallel load unit 304 starts consumption of the partial current IL according to the output of the load driving unit 410. As a result, the current, which flows from the current output unit 302 to the capacitor 216, is reduced, thereby reducing the terminal voltage Vo of the capacitor 216.

With such an arrangement, the parallel load unit 304 may consume the partial current IL by applying the partial current IL to the path provided in parallel with the resistor 212 during a period from the point in time at which the terminal voltage Vo of the capacitor 216 has become greater than the first reference voltage VH to the point in time in which the terminal voltage Vo has become smaller than the second reference voltage VL. Also, an arrangement may be made in which in a case that the electric potential detected by the differential detection unit 412 is smaller than a predetermined value, the parallel load unit 304 consumes the partial current IL.

Such an arrangement maintains the stable terminal voltage Vo of the capacitor 216 within a suitable range. Thus, the present embodiment has the advantage of maintaining the stable source voltage applied to the electronic device 50.

Now, let us say that the terminal voltage Vo of the capacitor 216 increases at the point in time T5 after the test, e.g., at the point in time 51, for example. In this case, the parallel load unit 304 also starts consumption of the partial current IL. This prevents excessive increase in the terminal voltage Vo.

Figure 7:
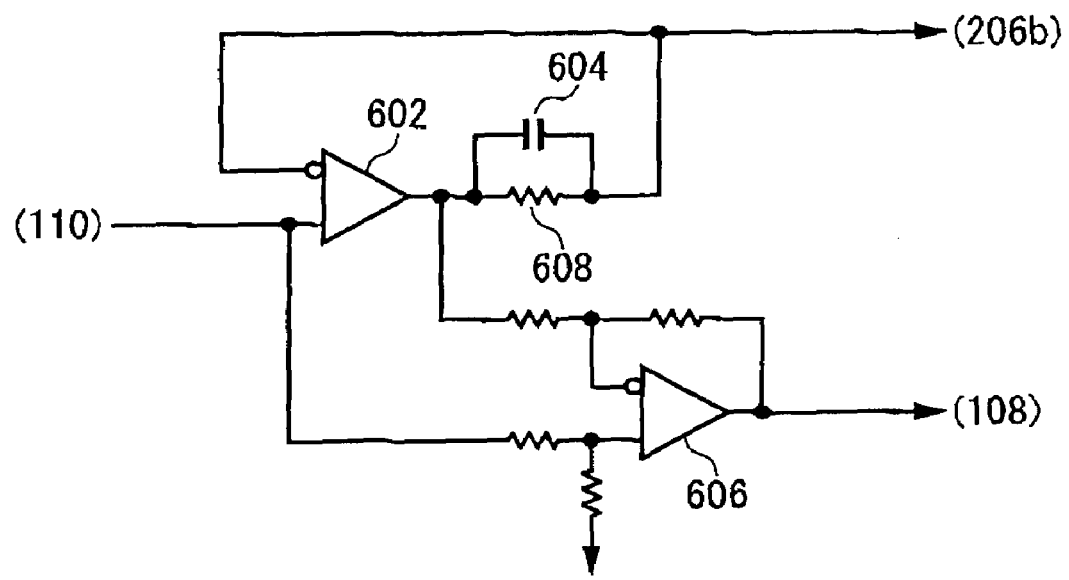
FIG. 7 is a diagram which shows an example of the configuration of a quiescent current measurement power supply 204.

FIG. 7 shows an example of the configuration of the quiescent current measurement power supply 204. With the present embodiment, the quiescent current measurement power supply 204 includes an op-amp 602, a capacitor 604, an op-amp 606, and multiple resistors.

The OP-amp 602 uses the output as negative feedback through the resistor 608. The OP-amp 602 outputs the output voltage to the connection line 206b through the resistor 608 corresponding to the voltage received from the control unit 110 as positive input. With such a configuration, the op-amp 602 outputs the voltage according to instructions of the control unit 110. Note that the capacitor 604 is connected in parallel with the resistor 608 for preventing oscillation of the op-amp 602.

The op-amp 606 forms a differential amplifier (subtraction circuit) in cooperation with the multiple resistors. The op-amp 606 receives the voltage, which is provided to the op-amp 602 from the control unit 110, as positive input through a resistor. Furthermore, the op-amp 606 receives the output of the op-amp 602 as negative input through another resistor. Then, the op-amp 606 notifies the determination unit 108 of the difference between the voltages received as positive input and the negative input.

Here, the negative input of the op-amp 602 with negative feedback has the same electric potential as the electric potential applied to the positive input of the op-amp 602 from the control unit 110. Accordingly, a current which flows through the resistor 608 is proportional to the difference between the voltage applied to the op-amp 602 from the control unit 110 and the output voltage of the op-amp 602. Thus, the quiescent current measurement power supply 204 outputs the output current, which is proportional to the aforementioned difference, to the connection line 206b.

Furthermore, with the present embodiment, the op-amp 606 notifies the determination unit 108 of the aforementioned difference. This allows the determination unit 108 to calculate the output current of the quiescent current measurement power supply 204 based upon the aforementioned difference and the electric resistance of the resistor 608.

Figure 8:
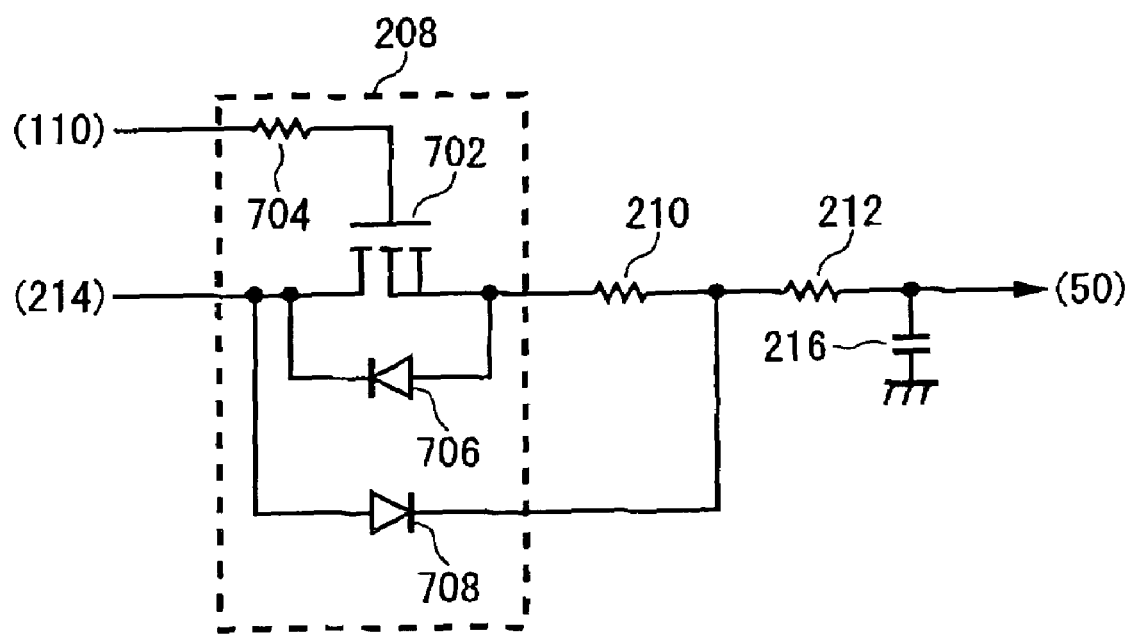
FIG. 8 is a diagram which shows an example of the configuration of a switch 208.

FIG. 8 shows an example of the configuration of the switch 208. With the present embodiment, the switch 208 includes a MOSFET 702, a resistor 704, and multiple diodes 706 and 708. The MOSFET 702 is mounted with the drain terminal and the source terminal connected to the capacitor 214 and the resistor 210, respectively. With such a configuration, in a case of turning on the MOSFET 702, the current received from the capacitor 214 is provided to the capacitor 216 through the resistors 210 and 212. Furthermore, the gate terminal of the MOSFET 702 is connected to the control unit 110 through the resistor 704. With such a configuration, the MOSFET 702 is controlled on/off with a proper switching speed according to instructions from the control unit 110. Furthermore, such a configuration prevents spike noise from occurring in the terminal voltage Vo of the capacitor 216, for example.

Let us say that the gate capacitance of the MOSFET 702 is 4000 pF, and the electric resistance of the resistor 704 is 100 Ω. In this case, the gate capacitance and the resistors 704 having such an electric resistance form an RC circuit with a time constant τ of around 0.4 μsec. Here, let us say that the settling time requires around 10 τ. Thus, the switch 208 allows switching thereof between the on-state and off-state in around 4 μsec.

Note that the MOSFET 702 represents an example of an MOS transistor having a function in which upon turning on, the MOS transistor electrically connects the capacitor 214 and the capacitor 216. On the other hand, the resistor 704 represents an example of a gate resistor with one terminal electrically connected to the gate terminal, and with the other terminal connected to the resistor 704 for receiving the control signal.

The diode 706 is connected between the source terminal and the drain terminal of the MOSFET 702 in the reverse direction of the direction from the capacitor 214 to the capacitor 216. With such a configuration, the diode 706 allows quick discharge of the capacitor 216 in response to the reduced output voltage of the current output unit 302 (see FIG. 2), for example.

On the other hand, the diode 708 is connected between the capacitor 214 and the resistor 212 in parallel with the MOSFET 702 and the resistor 210 in the forward direction with respect to the direction from the capacitor 214 to the capacitor 216. With such a configuration, in a case that the voltage between both terminals of the resistor 210 is greater than the threshold voltage of the diode 708, for example, the diode 708 allows the current to flow from the capacitor 214 to the capacitor 216, regardless of the state of the MOSFET 702. Thus, the diode 708 prevents excessive reduction in the terminal voltage Vo of the capacitor 216. The present embodiment enables proper connection between the current output unit 302 and the capacitor 216. For example, a Schottky diode may be employed as the diode 708. Description has been made regarding an arrangement in which the source current Io is measured prior to the measurement of the quiescent current with reference to FIG. 3. With such an arrangement, the diode 708 may be omitted, for example.

Figure 9:
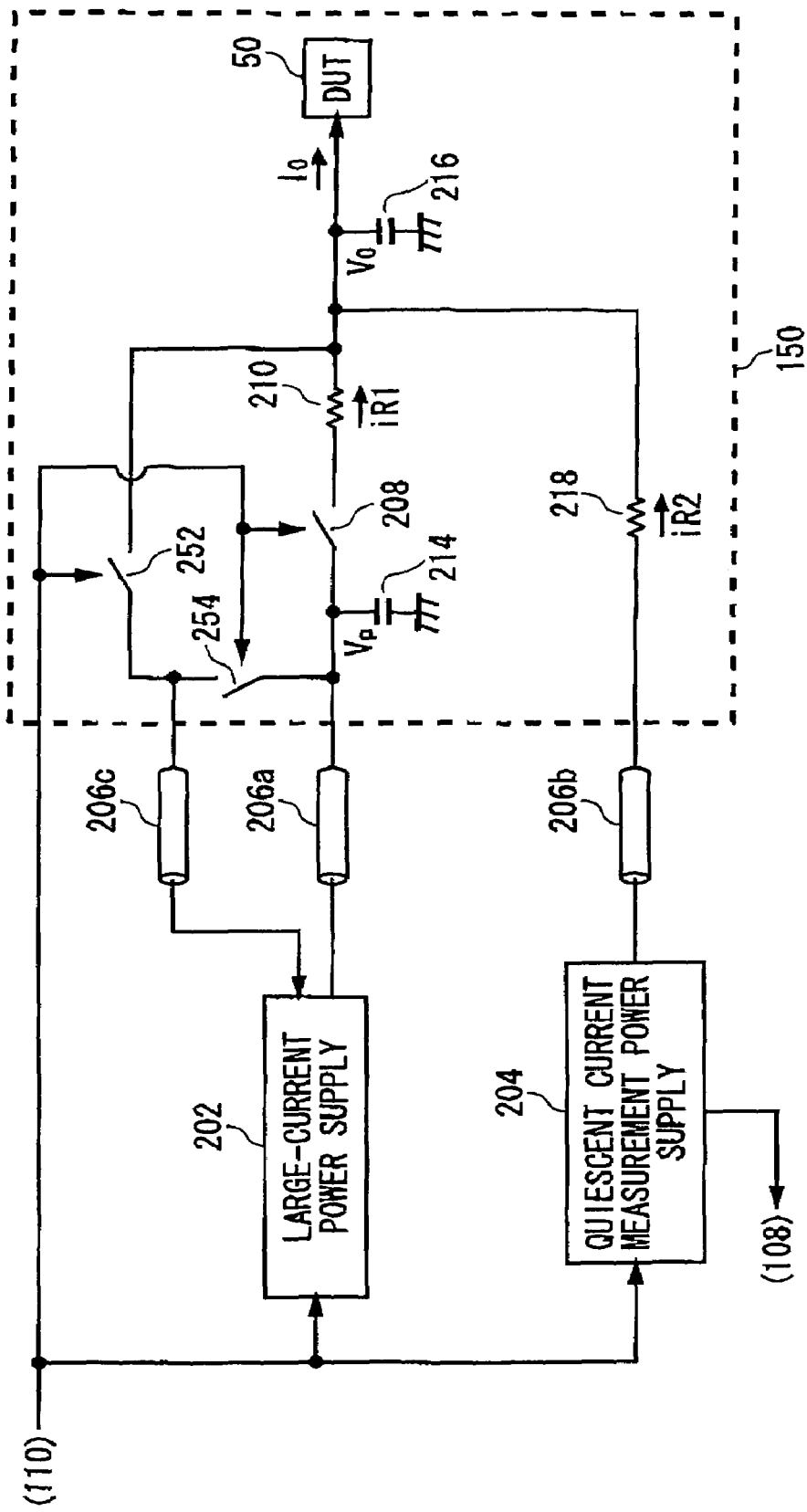
FIG. 9 is a diagram which shows another example of the configuration of the power supply unit 106.

FIG. 9 shows another example of the configuration of the power supply unit 106 with the electronic device 50. With the present embodiment, the power supply unit 106 includes a large-current power supply 202, a quiescent current measurement power supply 204, multiple connection lines 206a through 206c, multiple capacitors 214 and 216, multiple switches 208, 252, and 254, and multiple resistors 210 and 218. Note that the components denoted by the same reference numerals in FIG. 9 as those shown in FIG. 2 have the same configuration or the same functions as those shown in FIG. 2, except for the points described below, and accordingly, description thereof will be omitted.

Upon turning on the switch 254, the switch 254 electrically connects the capacitor 214 and the large-current power supply 202 through the connection line 206c. Upon turning on the switch 252, the switch 252 electrically connects the capacitor 216 and the large-current power supply 202 through the connection line 206c. The switches 252 and 254 may be controlled on/off according to instructions from the control unit 110.

The large-current power supply 202 receives the terminal voltage Vp of the capacitor 216 or the terminal voltage Vo of the capacitor 214 through the switch 252 or the switch 254. The large-current power supply 202 adjusts the output voltage corresponding to the terminal voltage thus received. Such an arrangement has the advantage of outputting the output voltage from the large-current power supply 202 with high precision.

Furthermore, with the present embodiment, the source current Io can be calculated with high precision based upon the second current iR2 output from the quiescent current measurement power supply 204. Thus, the present embodiment has the advantage of allowing high-precision test of the electronic device 50.

Figure 10:
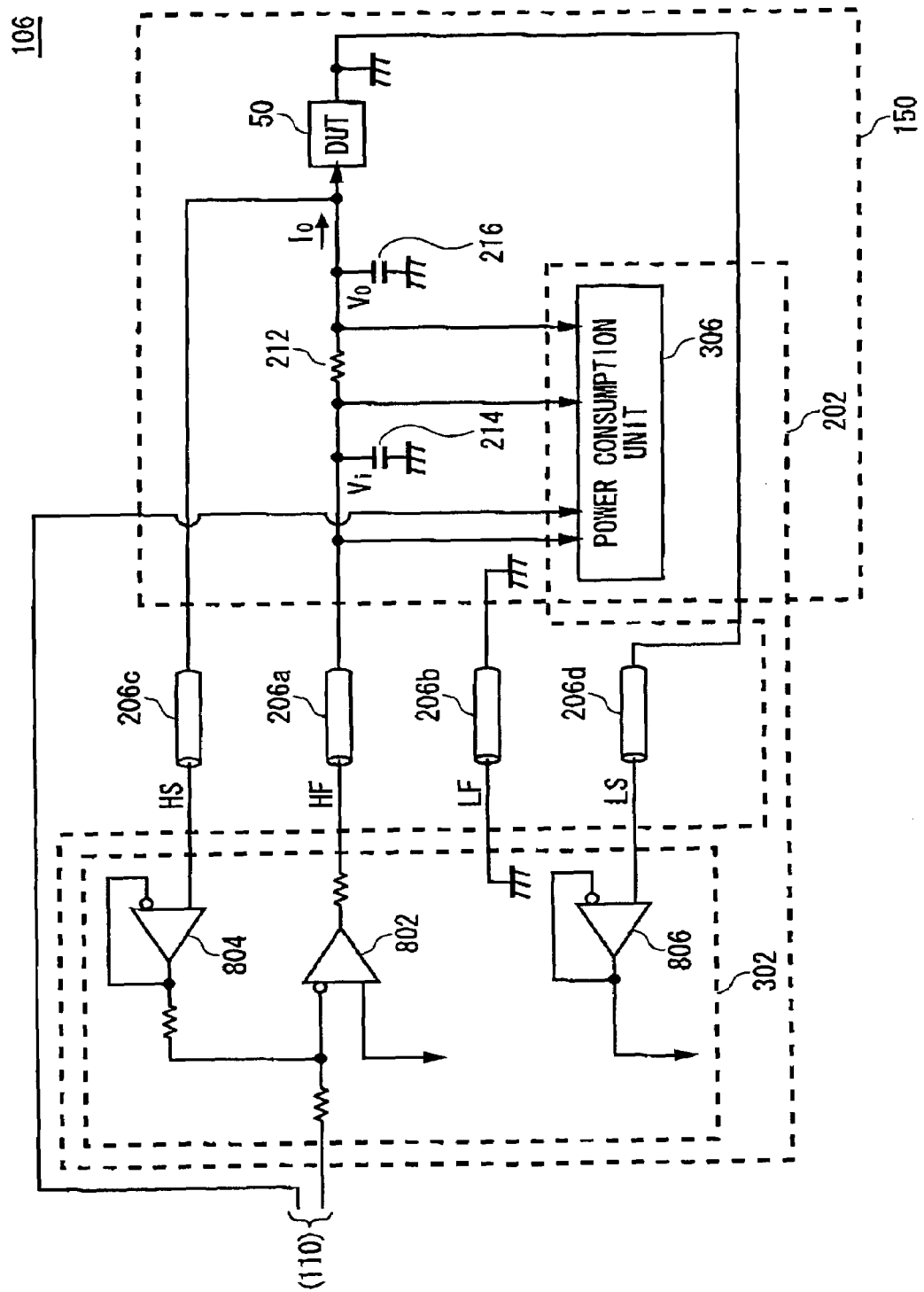
FIG. 10 is a diagram which shows a further example of the configuration of the power supply unit 106.

FIG. 10 shows a further example of the configuration of the power supply unit 106 with the electronic device 50. With the present embodiment the power supply unit 106 includes a large-current power supply 202, multiple connection lines 206a through 206d, multiple capacitors 214 and 216, and a resistor 212. Note that the components denoted by the same reference numerals in FIG. 10 as those shown in FIG. 2 have the same configuration or the same functions as those shown in FIG. 2, except for the points described below, and accordingly, description thereof will be omitted.

With the present embodiment, the connection line 206b electrically connects the ground terminal of the current output unit 302 and the ground terminal of the user interface 150. With such a configuration, the current output unit 302 and the user interface 150 are grounded with the same electric potential with high precision. On the other hand, the connection line 206c electrically connects one terminal of the capacitor 216 and the current output unit 302. On the other hand, the connection line 206 electrically connects the ground terminal of the electronic device 50 and the current output unit 302.

The current output unit 302 includes multiple voltage followers 804 and 806, an op-amp 802, and multiple resistors. The voltage follower 804 is connected to the capacitor 216 through the connection line 206c, and provides the same voltage as the terminal voltage Vo of the capacitor 216 to the negative input of the op-amp 802. The voltage follower 806 is connected to the ground terminal of the electronic device 50 through the connection line 206d, and provides the same voltage as the voltage at the ground terminal of the electronic device 50 to the positive input of the op-amp 802.

The op-amp 802 receives the voltage output from the control unit 110 through a resistor as positive input. The op-amp 802 outputs the voltage corresponding to the voltage thus received, to the connection line 206a through another resistor. With such a configuration, the op-amp 802 receives the terminal voltage Vo of the capacitor 216 which occurs corresponding to the output voltage, and the voltage of the ground terminal of the electronic device 50 through the voltage followers 804 and 806, respectively. Thus, the op-amp 802 is controlled via a feedback configuration. Thus, the present embodiment has the advantage of controlling the output voltage of the op-amp 802 with high precision. Furthermore, the present embodiment also has the advantage of maintaining the stable terminal voltage Vo of the capacitor 216 using the current consumption unit 306. Thus, the present embodiment has the advantage of allowing high-precision test of the electronic device 50.

Figure 11:
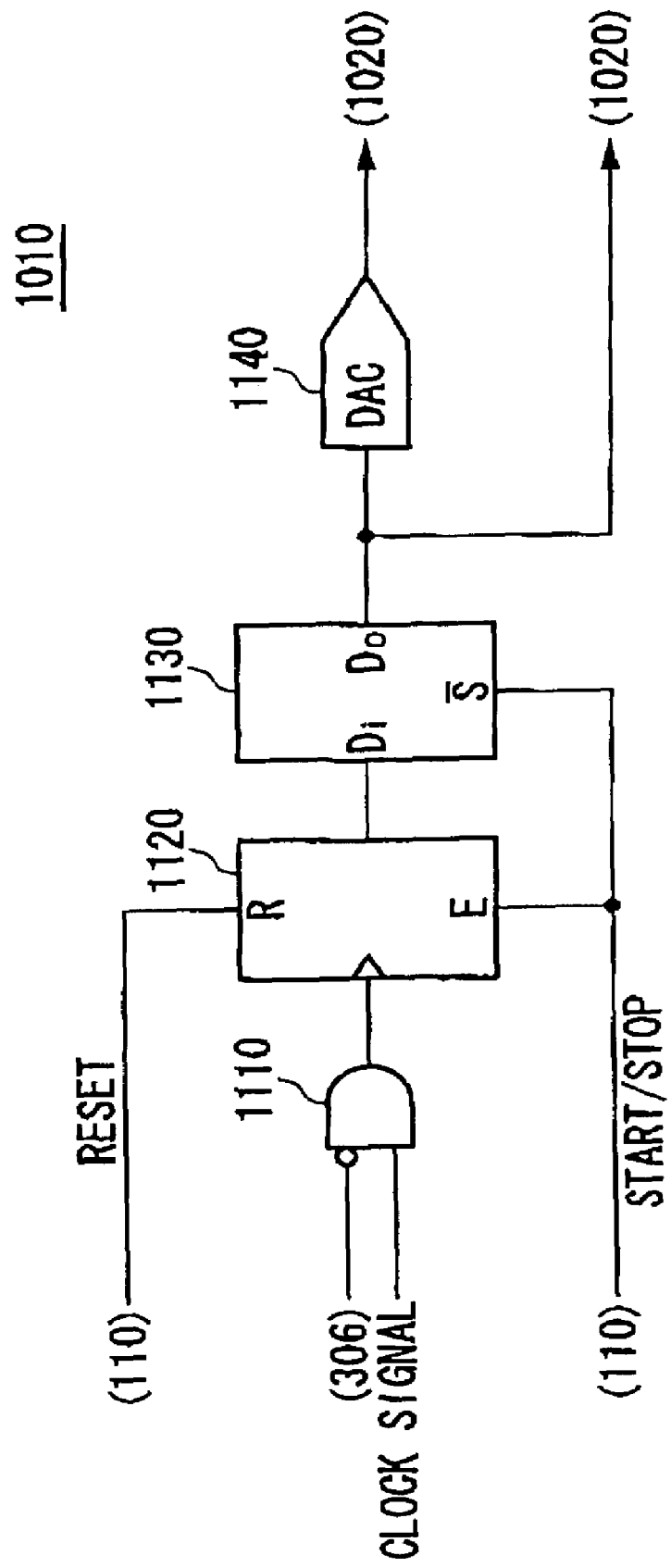
FIG. 11 is a diagram which shows the configuration of a time measurement unit 1010.

FIG. 11 shows a configuration of the time measurement unit 1010. The time measurement unit 1010 according to the present embodiment measures the off-time during which the high-speed switch 516 is in the off-state in the measurement period for measuring the average consumption current of the electronic device 50, thereby measuring the period in which the current consumption unit 306 stops consumption of the partial current IL.

The time measurement unit 1010 includes a logic circuit 1110, a counter 1120, a resistor 1130, and a DA converter 1140. The logic circuit 1110 provides a clock signal such as a reference clock signal of the test apparatus 100 or the like during the off-state of the high-speed switch 516, for example. More specifically, the logic circuit 1110 outputs the logical product of the inverted value of the signal output from the load driving unit 410 included within the current consumption unit 306 and the clock signal. With such a configuration, the logic circuit 1110 outputs the clock signal to the counter 1120 during the output of the L signal from the load driving unit 410, i.e., during the off-state of the high-speed switch 516.

The counter 1120 counts the off-time of the high-speed switch 516 in the measurement period based upon the clock signal supplied from the logic circuit 1110 during the off-state of the high-speed switch 516. More specifically, the control unit 110 inputs a reset signal to the counter 1120 prior to the measurement period. In response to the reset signal, the counter 1120 initializes the count value. Next, the control unit 110 provides an H logical signal as the start/stop signal during the measurement period. The H logical signal thus received enables the counter 1120 to count the clock signal, thereby counting the clock signal provided from the logic circuit 1110. Then, upon completion of the measurement period, the control unit 1110 switches the start/stop signal to an L logic signal. In response to the L logic signal thus received, the counter 1120 stops counting of the clock signal.

The resistor 1130 inputs the count value output from the counter 1120 as the data input signal Di, and stores the data input signal Di at the end of the measurement period. Then, the resistor 1130 outputs the data input signal Di as the data output signal Do. More specifically, the resistor 1130 stores the count value at the end of a measurement period, i.e., at the point in time when the start/stop signal switches from the H logical signal to the L logical signal. Note that an arrangement may be made in which the resistor 1130 stores only the upper one or more bits of the count value output from the counter 1120, and outputs only the upper bits as the data output signal Do.

The DA converter 1140 converts the off-time of the high-speed switch 516 in increments of a cycle, which has been counted by the counter 1120 and stored in the resistor 1130, into an analog value.

With such an arrangement as described above, the control unit 110 sets the measurement period to a period obtained by multiplying the cycle time of the clock signal by 2 to the power of n (note that n represents an positive integer). With such an arrangement, the counter 1120 counts the off-time of the high-speed switch 516 in the measurement period in increment of a period obtained by dividing the measurement period by 2 to the power of n. Such an arrangement in which the measurement period is set as described above has the advantage as follows. That is to say, such an arrangement can use the aforementioned count value as the ratio of the off-time of the high-speed switch 516 as to the overall measurement period, with the (n)th bit from the lowermost bit as the number of units, and with the bits equal to or lower than the (n−1)th bit as the number of decimal places.

Also, the logic circuit 1110 may be a logic circuit (AND logic circuit) for outputting the logical product of the signal output from the load driving unit 410 and the clock signal, instead of the logic circuit 1110 having the aforementioned configuration. Such an arrangement allows measurement of the on-time of the high-speed switch 516, instead of the off-time of the high-speed switch 516.

Figure 12:
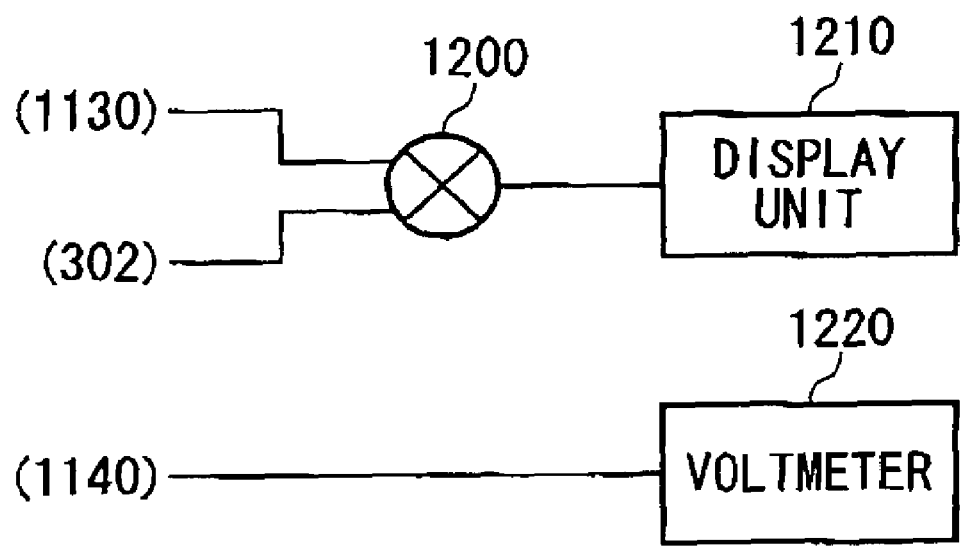
FIG. 12 is a diagram which shows an example of the configuration of a consumed current calculation unit 1020.

FIG. 12 shows an example of the configuration of the consumed current calculation unit 1020. The consumed current calculation unit 1020 calculates and displays the average consumed current of the electronic device 50 over the measurement period in the functional test based upon the on-time or off-time of the high-speed switch 516 measured by the time measurement unit 1010 and the current value of the output current of the current output unit 302. The consumed current calculation unit 1020 according to the present embodiment may be employed in an arrangement in which in a case that the high-speed switch 516 is in the on-state, the parallel load unit 304 consumes the same amount of the partial current IL as the output current of the current output unit 302.

The consumed current calculation unit 1020 according to the present embodiment calculates the average consumed current by multiplying the average value of the output current of the current output unit 302 over the measurement period by the ratio of the off-time of the high-speed switch 516 as to the measurement period. The consumed current calculation unit 1020 includes a multiplier 1200, a display unit, and a voltmeter 1220.

The multiplier 1200 inputs the average of the output current of the current output unit 302 over the measurement period from the current output unit 302. Furthermore, the multiplier 1200 inputs the count value of the counter 1120 through the resistor 1130. Then, the multiplier 1200 multiplies the average of the output current over the measurement period by the ratio of the off-time of the high-speed switch 516 as to the measurement period, thereby calculating the average consumed current of the electronic device 50. The display unit 1210 displays the average consumed current of the electronic device 50 thus calculated by the multiplier 1200.

The voltmeter 1220 measures and displays the voltage of the analog signal output from the DA converter 1140. Let us say that the consumed current measurement unit 1000 allows the user to read out the output voltage of the DA converter 1140, thereby allowing the user to calculate the ratio of the output voltage of the DA converter 1140 as to the maximum count value (2 to the power of n) which corresponds to the measurement period. Furthermore, let us say that the consumed current measurement unit 1000 allows the user to read out the average of the output voltage of the current output unit 302. In this case, the user can calculate the average consumed current based upon these values thus read out in the same way as with the multiplier 1200. With such an arrangement, the DA converter 1140 and the voltmeter 1220 can be connected through a single analog signal line. This allows simple configuration as compared with an arrangement employing digital signal lines.

Figure 13:
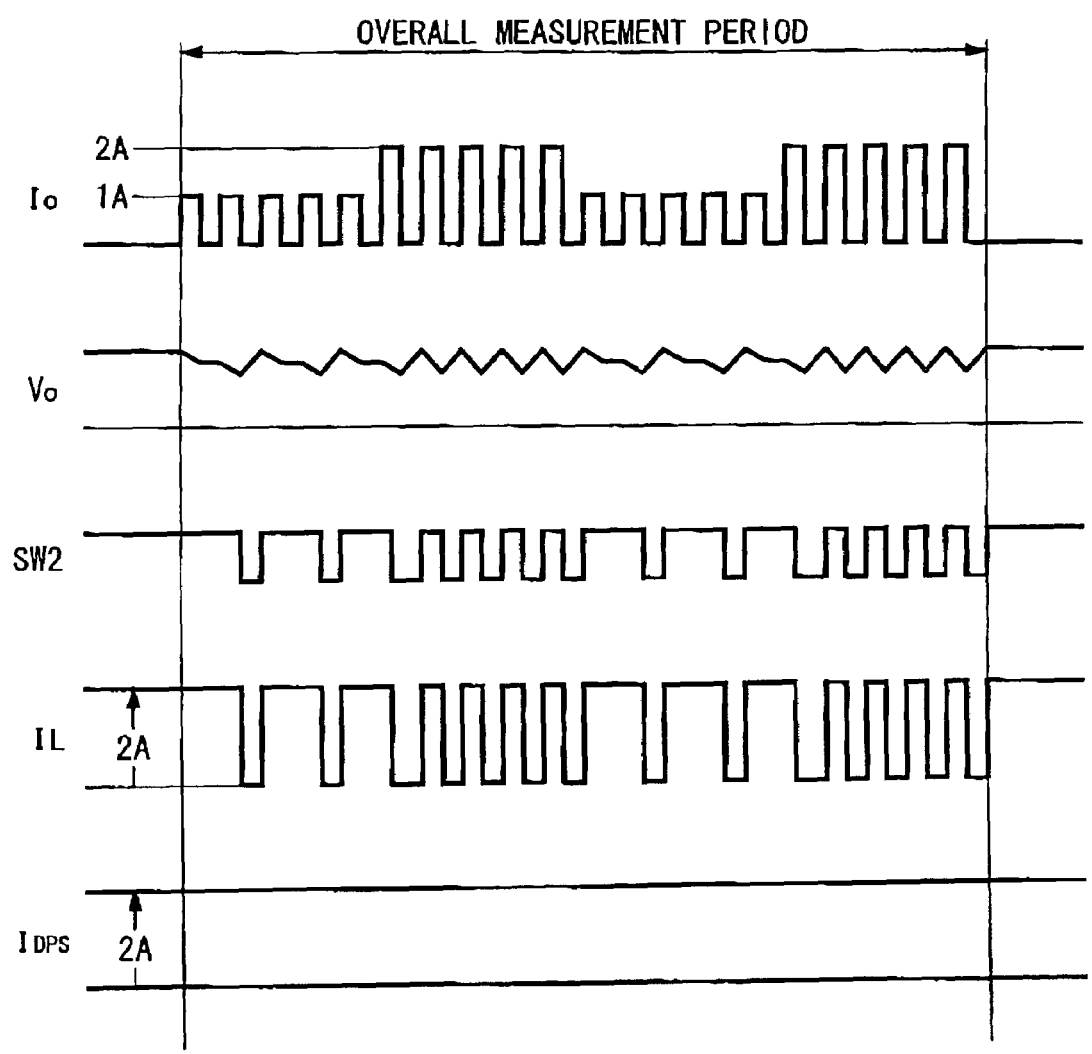
FIG. 13 is a timing chart which shows an example of the operation of the current consumption unit 306 during a measurement period.

FIG. 13 shows an example of the operation of the current consumption unit 306 during the measurement period, which is employed in an arrangement in which the average consumed current of the electronic device 50 is measured using the time measurement unit 1010 and the consumed current calculation unit 1020 shown in FIGS. 11 and 12. With such an arrangement, in a case that the high-speed switch 516 is in the on-state, the parallel load unit 304 consumes the same amount of the partial current IL as the output current IDPS of the current output unit 302. Such a state can occur when the electronic device 50 does not operate, and the consumed current thereof is almost 0 A.

The electronic device 50 performs actions corresponding to the functional test during the measurement period. As a result, the source current Io input to the electronic device 50 is switched between 0 A, 1 A, and 2 A, as shown in FIG. 13, for example. On the other hand, the terminal voltage Vo of the capacitor 216 changes due to the actions of the electronic device 50. In this case, the output SW2 of the load driving unit 410 performs switching operation so as to suppress change in the terminal voltage Vo. As a result, the high-speed switch 516 is properly controlled on/off so as to suppress the change in the terminal voltage Vo.

In a case that the high-speed switch 516 is in the on-state, the partial current IL exhibits the same value (2 A in the present arrangement) as that of the output current IDPS. On the other hand, in a case that the high-speed switch 516 is in the off-state, the partial current IL becomes 0 A. Accordingly, the average of the source current Io of the electronic device 50, i.e., the average consumed current of the electronic device 50 is calculated using the following expression (1).

The average of $Io$=the average of $IDPS$×(off-time of the high-speed switch 516/measurement period)     (1)

Accordingly, the consumed current calculation unit 1020 calculates the average consumed current of the electronic device 50 by multiplying the average of the output current IDPS over the measurement period by the ratio of the off-time of the high-speed switch 516 as to the measurement period. Furthermore, the consumed current measurement unit 1000 allows the user to read out the average of the output current IDPS from the current output unit 302, and read out the ratio of the off-time of the high-speed switch 516 from the voltmeter 1220. Thus, the user can calculate the average consumed current of the electronic device.

Figure 14:
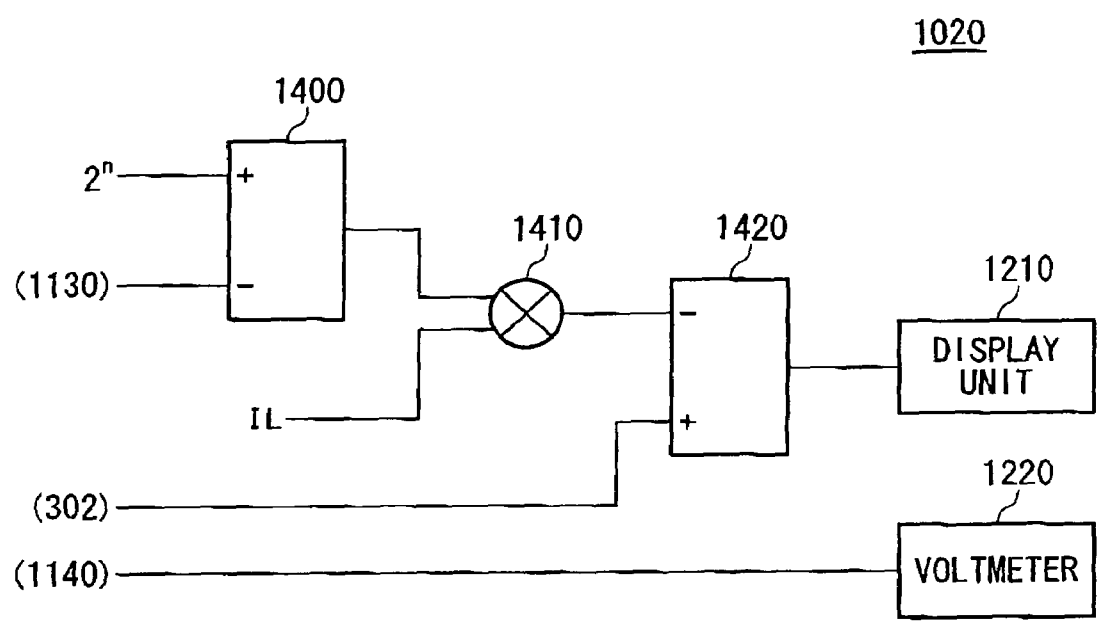
FIG. 14 is a diagram which shows another example of the configuration of the consumed current calculation unit 1020.

FIG. 14 shows another example of the configuration of the consumed current calculation unit 1020. With the consumed current calculation unit 1020 according to the present embodiment, the average consumed current of the electronic device 50 is calculated and displayed based upon the on-time or off-time of the high-speed switch 516 measured by the time measurement unit 1010, the current value of the output current, and the current value of the partial current of the parallel load unit 304 in the on-state of the high-speed switch 516. The consumed current calculation unit 1020 according to the present embodiment may be employed in an arrangement in which the parallel load unit 304 consumes an different amount of the partial current IL from that of the output current of the current output unit 302.

The consumed current calculation unit 1020 according to the present embodiment calculates the average consumed current by subtracting the product of the current value of the partial current in the on-state of the high-speed switch 516 and the ratio of the on-time as the measurement period from the average of the output current over the measurement period. The consumed current calculation unit 1020 according to the present embodiment includes a subtractor 1400, a multiplier 1410, a subtractor 1420, a display unit 1210, and a voltmeter 1220. Note that the display unit 1210 and the voltmeter 1220 have the same configurations and functions as those shown in FIG. 12, and accordingly, description thereof will be omitted.

The subtractor 1400 subtracts the off-time of the high-speed switch 516 from the measurement period, thereby calculating the on-time of the high-speed switch 516. More specifically, the subtractor 1400 subtracts the number of cycles of the off-state of the high-speed switch 516, i.e., the count value supplied through the resistor 1130, from 2 to the power of n, which corresponds to the number of cycles over the measurement period. Here, the output of the subtractor 1400 may be used as the ratio of the on-time of the high-speed switch 516 as to the measurement period.

The multiplier 1410 multiplies the current value of the partial current IL in the on-state of the high-speed switch 516 by the ratio of the on-time of the high-speed switch 516 as to the measurement period output from the subtractor 1400. The subtractor 1420 subtracts the product output of the subtractor 1410, from the average of the output current IDPS of the current output unit 302 over the measurement period.

Figure 15:
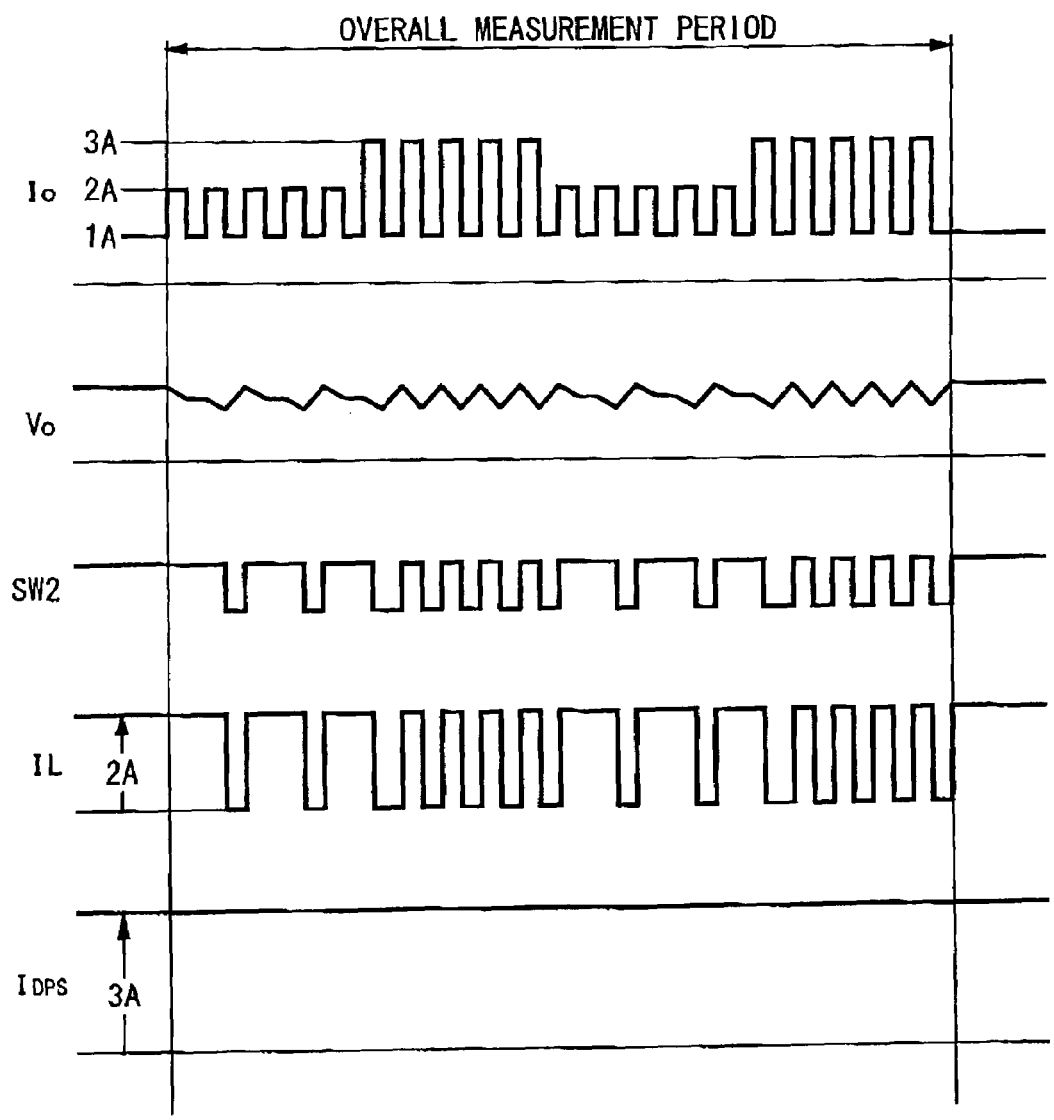
FIG. 15 is another example of the operation of the current consumption unit 306 during a measurement period.

FIG. 15 shows an example of the operation of the current consumption unit 306 during the measurement period, which is employed in an arrangement in which the average consumed current of the electronic device 50 is measured using the time measurement unit 1010 and the consumed current calculation unit 1020 shown in FIGS. 11 and 13. With the present embodiment, in a case that the high-speed switch 516 is in the on-state, the parallel load unit 304 consumes a smaller amount of the partial current IL than the output current IDPS of the current output unit 302. Such a state can occur when the electronic device 50 does not operate, but the consumed current thereof does not become 0 A.

The electronic device 50 performs actions corresponding to the functional test during the measurement period. As a result, the source current Io input to the electronic device 50 is switched between 0 A, 1 A, 2 A, and 3 A, as shown in FIG. 15, for example. On the other hand, the terminal voltage Vo of the capacitor 216 changes due to the actions of the electronic device 50. In this case, the output SW2 of the load driving unit 410 is controlled on/off so as to suppress change in the terminal voltage Vo. As a result, the high-speed switch 516 is properly controlled on/off so as to suppress the change in the terminal voltage Vo.

In a case that the high-speed switch 516 is in the on-state, the partial current IL exhibits a smaller value (2 A in the present arrangement) than that of the output current IDPS (3 A in the present arrangement). On the other hand, in a case that the high-speed switch 516 is in the off-state, the partial current IL becomes 0 A. Accordingly, the average consumed current of the electronic device 50 is calculated using the following expression (2).

The average of $Io$=the average of $IDPS$–$IL$ in the on-state× (2)

Here, the term is equal to (on-time of the high-speed switch 516/measurement period). Thus, the consumed current calculation unit 1020 subtracts the product of the partial current IL in the on-state of the high-speed switch 516 and the ratio of the on-time as to the measurement period from the average of the output current IDPS over the measurement period, thereby calculating the average consumed current of the electronic device 50. Also, the consumed current measurement unit 1000 allows the user to read out the average of the output current IDPS from the current output unit 302, and read out the ratio of the off-time of the high-speed switch 516 from the voltmeter 1220. Thus, the user can calculate the average consumed current of the electronic device 50 based upon these values thus read out and the current value of the partial current IL in the on-state of the high-speed switch 516.

As described above, the consumed current measurement unit 1000 allows measurement of the average consumed current of the electronic device 50 based upon the output current of the current output unit 302, the on-time or off-time of the high-speed switch 516, and/or the partial current in the on-state of the high-speed switch 516 while performing proper switching operation of the high-speed switch 516 so as to suppress the source voltage applied to the electronic device 50 over the period of the functional test. This allows proper measurement of the average consumed current of the electronic device 50 using an arrangement in which the current output unit 302 supplies a constant output current, and a partial current is properly consumed corresponding to the actions of the electronic device 50.

While description has been made regarding the present invention with reference to the embodiments, the technical scope of the present invention is not restricted to the precise embodiments described above. It can be readily conceived by those skilled in this art that various changes and modifications may be made. It is needless to say that such various changes and modifications are also encompassed in the technical scope of the present invention as defined in the appended claims.

INDUSTRIAL APPLICABILITY

The present invention provides a high-precision test of an electronic device.

What is claimed is:

1. A power supply device for supplying source current to an electronic device comprising:
    a current output unit for outputting output current including at least said source current as a component of the current thereof;
    a connection resistor which electrically connects said current output unit and said electronic device for supplying said source current from said current output unit to said electronic device;
    a low-pass filter having a cut-off frequency lower than the frequency at which said source current applied to said electronic device changes, for allowing the output voltage of said current output unit to pass through while suppressing components frequencies higher than said cut-off frequency;
    a differential detection unit for detecting the electric potential difference between the output voltage of said low-pass filter and the electric potential at the device-side terminal of said connection resistor, which is closer to said electronic device; and
    a parallel load unit which is connected to the output terminal of said current output unit in parallel with said connection resistor, and which has a function of consuming a partial current which is a part of said output current of said current output unit in a case that said electric potential difference detected by said differential detection unit is smaller than a predetermined value, and which has a function of stopping reception of said partial current from said current output unit in a case that said electric potential difference detected by said differential detection unit has become greater than a predetermined value,
    wherein said parallel load unit includes a switch for performing opening/closing actions according to the output of said differential detection unit, and
    wherein said power supply device further includes a time measurement unit for measuring on-time, for which said switch is in the on-state, or off-time, for which said switch is in the off-state, in a measurement period for the average consumed current of said electronic device.

2. A power supply device according to claim 1, further comprising:
    a smoothing capacitor which is provided at a position upstream of said connection resistor in the current direction, and which has a function of smoothing said source current; and
    a device-side capacitor with a smaller electrostatic capacitance than that of said smoothing capacitor, which is provided at a position downstream of said connection resistor in the current direction, and which has a function of smoothing said source current applied to said electronic device through said connection resistor.

3. A power supply device according to claim 1, wherein at least a part of said low-pass filter, said differential detection unit, and said parallel load unit is provided on a printed wiring board on which wiring has been formed for electrically connecting said current output unit and said electronic device, and wherein said connection resistor is a pattern resistor formed on said printed wiring board.

4. A power supply device according to claim 1, wherein said differential detection unit includes:
    a reference voltage output unit for outputting either a first reference voltage or a second reference voltage, which is smaller than said first reference voltage, by dividing the output voltage of said low-pass filter; a comparison unit for making a comparison between said reference voltage output from said reference voltage output unit and the electric potential at said device-side terminal; and
    a reference voltage setting unit which has a function of controlling said reference voltage output unit so as to output said second reference voltage in a case that the electric potential at said device-side terminal becomes greater than said first reference voltage, and which has a function of controlling said reference voltage output unit so as to output said first reference voltage, in a case that the electric potential at said device-side terminal becomes smaller than said second reference voltage, according to the output of said comparison unit,
    wherein said parallel load unit consumes said partial current received from said current output unit by applying said partial current to a path provided in parallel with said connection resistor during a period from the point in time that the electric potential at said device-side terminal has become greater than said first reference voltage up to the point in time that said electric potential has become smaller than said second reference voltage, according to the output of said comparison unit, and wherein said parallel load unit stops application of said partial current to said parallel path during a period from the point in time that the electric potential at said device-side terminal has become smaller than said second reference voltage up to the point in time that said electric potential has become greater than said first reference voltage according to the output of said comparison unit.

5. A power supply device according to claim 1, wherein said parallel load unit includes:
   a low-speed switch connected in parallel with said connection resistor for performing opening/closing actions at a lower switching speed than the response speed at which said output current of said current output unit changes in response to change in said source current applied to said electronic device; and
   a high-speed switch, connected in parallel with said connection resistor and in series with said low-speed switch, for performing opening/closing actions at a higher switching speed than said response speed of said current output unit according to the output of said differential detection unit.

6. A power supply device according to claim 5, wherein said low-speed switch is turned on after the output voltage of said low-pass filter has become approximately the same as the output voltage of said current output unit.

7. A power supply device according to claim 1, wherein said time measurement unit includes:
   a counter for counting said on-time or said off-time in said measurement period in increments of a cycle which is obtained by dividing said measurement period by the 2 to the power of n (note that n represents a positive integer); and
   a DA converter for converting said on-time or said off-time, counted by said counter in increments of said cycle, into an analog value.

8. A power supply device according to claim 1, further including a consumed current calculation unit for calculating the average consumed current of said electronic device over said measurement period based upon said on-time or said off-time measured by said time measurement unit and the current value of said output current.

9. A power supply device according to claim 8, wherein in a case that said switch is in the on-state, said parallel load unit consumes the same amount of said partial current as that of said output current, and wherein said consumed current calculation unit calculates said average consumed current by multiplying the average of said output current over said measurement period by the ratio of said off-state as to said measurement period.

10. A power supply device according to claim 8, wherein said consumed current calculation unit calculates said average consumed current based upon the current value of said partial current in the on-state of said switch.

11. A power supply device according to claim 10, wherein said consumed current calculation unit calculates said average consumed current by subtracting the product of the current value of said partial current in the on-state of said switch and the ratio of said on-time as to said measurement period from the average of said output current over said measurement period.

12. A power supply device according to claim 1, further including a consumed current measurement unit for calculating the average consumed current of said electronic device over a predetermined measurement period based upon the values of said output current and said partial current in said measurement period.

13. A test apparatus for testing an electronic device comprising:
   a current output unit for outputting output current including at least source current to be applied to said electronic device as a component of the current thereof;
   a connection resistor which electrically connects said current output unit and said electronic device for supplying said source current from said current output unit to said electronic device;
   a low-pass filter having a cut-off frequency lower than the frequency at which said source current applied to said electronic device changes, for allowing the output voltage of said current output unit to pass through while suppressing components of frequencies higher than said cut-off frequency;
   a differential detection unit for detecting the electric potential difference between the output voltage of said low-pass filter and the electric potential at the device-side terminal of said connection resistor, which is closer to said electronic device; a parallel load unit which is connected to the output terminal of said current output unit in parallel with said connection resistor, and which has a function of consuming a partial current which is a part of said output current of said current output unit in a case that said electric potential difference detected by said differential detection unit is smaller than a predetermined value, and which has a function of stopping reception of said partial current from said current output unit in a case that said electric potential difference detected by said differential detection unit has become greater than a predetermined value;
   a pattern generating unit for generating a test pattern to be input to said electronic device; a signal input unit for supplying said test pattern to said electronic device which receives said source current; and a determination unit for determining the quality of said electronic device based upon the signal output from said electronic device in response to said test pattern,
   wherein said parallel load unit includes a switch for performing opening/closing actions according to the output of said differential detection unit, and
   wherein said power supply device further includes a time measurement unit for measuring on-time, for which said switch is in the on-state, or off-time, for which said switch is in the off-state, in a measurement period for the average consumed current of said electronic device.

14. A power supply voltage stabilizing device for stabilizing the source voltage of a power supply device for supplying source current to an electronic device,
   wherein said power supply device includes:
      a current output unit for outputting output current including at least said source current as a component of the current thereof; and a connection resistor which electrically connects said current output unit and said electronic device for supplying said source current from said current output unit to said electronic device; and wherein said power supply voltage stabilizing device includes:
  a low-pass filter having a cut-off frequency lower than the frequency at which said source current applied to said electronic device changes, for allowing the output voltage of said current output unit to pass through while suppressing components of frequencies higher than said cut-off frequency;
  a differential detection unit for detecting the electric potential difference between the output voltage of said low-pass filter and the electric potential at the device-side terminal of said connection resistor, which is closer to said electronic device; and
  a parallel load unit which is connected to the output terminal of said current output unit in parallel with said connection resistor, and which has a function of consuming a partial current which is a part of said output current of said current output unit in a case that said electric potential difference detected by said differential detection unit is smaller than a predetermined value, and which has a function of stopping reception of said partial current from said current output unit in a case that said electric potential difference detected by said differential detection unit has become greater than a predetermined value, wherein said parallel load unit includes a switch for performing opening/closing actions according to the output of said differential detection unit, and wherein said power supply device further includes a time measurement unit for measuring on-time, for which said switch is in the on-state, or off-time, for which said switch is in the off-state, in a measurement period for the average consumed current of said electronic device.

* * * * *